(12) United States Patent
Herse et al.

(10) Patent No.: US 11,757,273 B2
(45) Date of Patent: *Sep. 12, 2023

(54) ROTARY CABLE MANAGEMENT SYSTEM FOR SENSOR PLATFORMS

(71) Applicant: GM Cruise Holdings LLC, San Francisco, CA (US)

(72) Inventors: Nathaniel Barrett Herse, San Francisco, CA (US); Roger Lo, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/700,010

(22) Filed: Mar. 21, 2022

(65) Prior Publication Data

US 2022/0209520 A1 Jun. 30, 2022

Related U.S. Application Data

(63) Continuation of application No. 16/589,079, filed on Sep. 30, 2019, now Pat. No. 11,316,334.

(51) Int. Cl.
*H02G 11/02* (2006.01)
*H05K 1/02* (2006.01)
(Continued)

(52) U.S. Cl.
CPC ............ *H02G 11/02* (2013.01); *G01D 11/30* (2013.01); *G05D 1/0088* (2013.01);
(Continued)

(58) Field of Classification Search
CPC ...... H02G 11/02; G01D 11/30; G05D 1/0088; G05D 1/0214; G05D 2201/0213; H05K 1/0277; H05K 2201/10151; H05K 2201/10356; H05K 1/147; H05K 2201/051; H05K 2201/10189; B60R 16/03; G01S 13/931; G01S 13/426
(Continued)

(56) References Cited

U.S. PATENT DOCUMENTS 6,108,976 A * 8/2000 Kato ....................... E05F 15/00
49/352
6,548,982 B1 * 4/2003 Papanikolopoulos . B62D 57/02
446/457
(Continued)

*Primary Examiner* — Nathaniel T Woodward
(74) *Attorney, Agent, or Firm* — Novak Druce Carroll LLP

(57) ABSTRACT

Cable management systems for rotatable sensors on an autonomous vehicle (AV) are described herein. In some examples, a rotatable cable assembly can include a first portion having a spool, a sidewall surrounding the spool to form a cavity, and a shaft extending from the spool; a second portion coupled to the shaft and configured to rotate relative to the first portion; a flexible cable stored by the spool in a coiled configuration within the cavity; a first circuit on the first portion including a first connector coupled to an end of the flexible cable and configured to connect to components on an AV and/or a sensor platform base that is coupled to the AV and includes the rotary cable assembly; and a second circuit on the second portion including a second connector coupled to another end of the flexible cable and configured to rotate with the second portion.

20 Claims, 17 Drawing Sheets

(51) Int. Cl.
*G05D 1/00* (2006.01)
*G01D 11/30* (2006.01)
*B60R 16/03* (2006.01)
*G05D 1/02* (2020.01)

(52) U.S. Cl.
CPC ............ *H05K 1/0277* (2013.01); *B60R 16/03* (2013.01); *G05D 1/0214* (2013.01); *G05D 2201/0213* (2013.01); *H05K 2201/10151* (2013.01); *H05K 2201/10356* (2013.01)

(58) Field of Classification Search
USPC ........................................................ 73/866.5
See application file for complete search history.

(56) References Cited

U.S. PATENT DOCUMENTS

| | | | |
|---|---|---|---|
| 10,535,271 | B1 | 1/2020 | Dyer et al. |
| 11,117,527 | B2 * | 9/2021 | Cao ........................ B60R 11/04 |
| 2011/0208416 | A1 | 8/2011 | Speier et al. |
| 2015/0149018 | A1 | 5/2015 | Attard et al. |
| 2015/0338852 | A1 | 11/2015 | Ramanujam |
| 2017/0369052 | A1 | 12/2017 | Nagy et al. |
| 2018/0003529 | A1 * | 1/2018 | Ko ..................... B60R 11/0258 |
| 2018/0060827 | A1 | 3/2018 | Abbas et al. |
| 2018/0134234 | A1 * | 5/2018 | Nickolaou ............. F16M 11/10 |
| 2019/0184942 | A1 * | 6/2019 | Vaishnav ................. B08B 1/04 |
| 2019/0297045 | A1 | 9/2019 | Orsini |

* cited by examiner

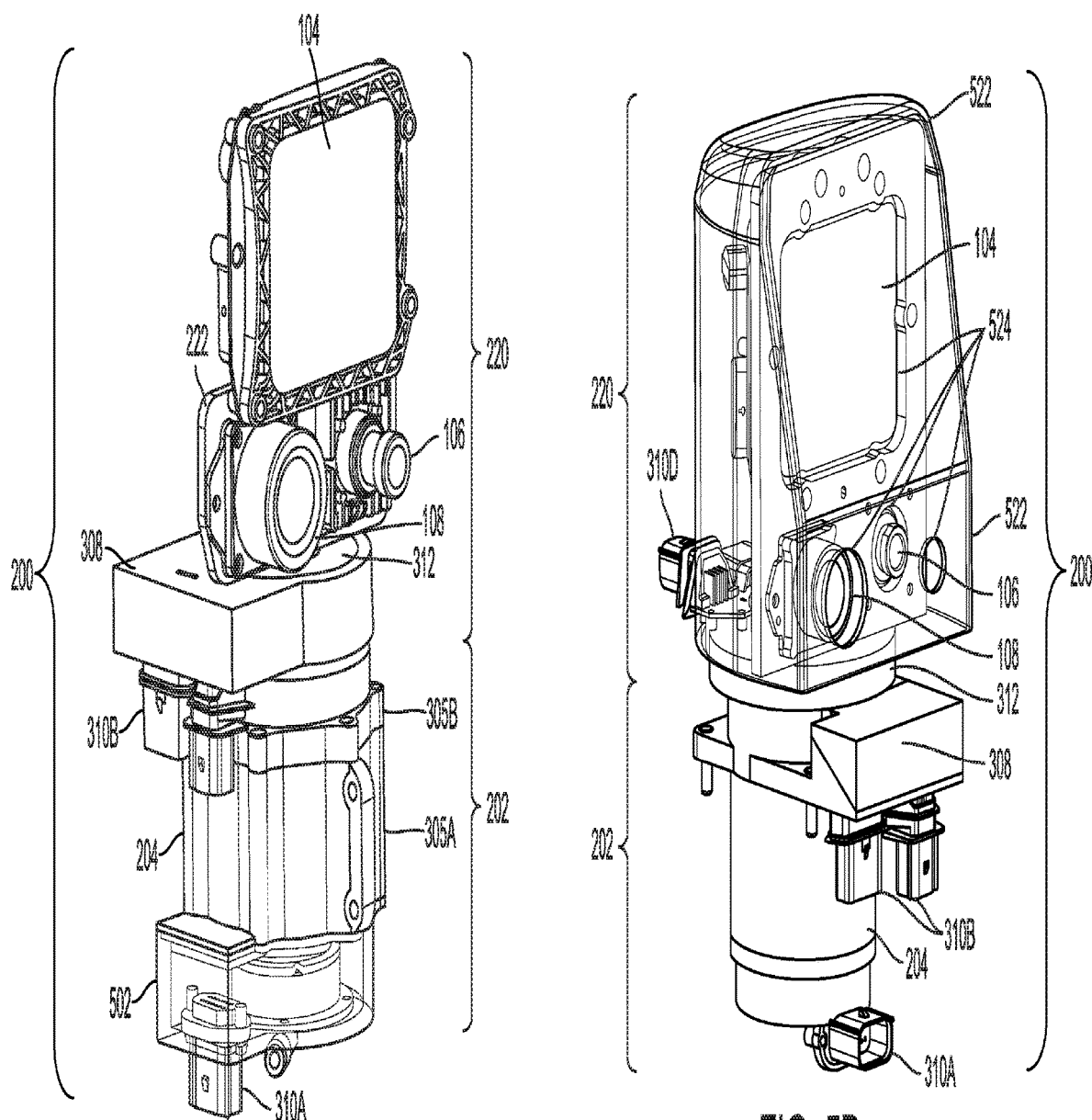

ROTARY CABLE MANAGEMENT SYSTEM FOR SENSOR PLATFORMS

CROSS-REFERENCE TO RELATED APPLICATIONS

This application is a continuation of U.S. application Ser. No. 16/589,079, filed on Sep. 30, 2019, entitled, ROTARY CABLE MANAGEMENT SYSTEM FOR SENSOR PLATFORMS, which is hereby expressly incorporated by reference in its entirety and for all purposes.

TECHNICAL FIELD

The present disclosure generally relates to cable management systems for sensor implementations on autonomous vehicles.

BACKGROUND

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, amongst others. The sensors collect data and measurements that the autonomous vehicle can use for operations such as navigation. The sensors can provide the data and measurements to an internal computing system of the autonomous vehicle, which can use the data and measurements to control a mechanical system of the autonomous vehicle, such as a vehicle propulsion system, a braking system, or a steering system. Typically, the sensors are mounted at fixed locations on the autonomous vehicles.

The field of view and coverage of sensors can depend on their capabilities and placement (e.g., location, angle, etc.). In the context of autonomous vehicles, the field of view and coverage of sensors can also be significantly impacted by changes in motion, driving angles and direction, as well as changes in their environment, including relative changes in the motion, angle, and position of surrounding objects. For example, as an autonomous vehicle travels and performs various driving maneuvers, the position and perspective of the sensors relative to the vehicle's surroundings also change. The changes in the relative position and perspective of the sensors can create blind spots and reduce their field of coverage, thereby limiting what the sensors can "see" or detect. However, autonomous vehicles need to have a robust understanding of their environment to safely operate, and because they largely rely on sensors to navigate and understand their environment, a sensor blind spot or reduced field of coverage can create significant risks to human lives and property.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which:

FIG. 5A illustrates an example assembled configuration of a sensor positioning platform, in accordance with some examples;

FIG. 5B illustrates another example assembled configuration of a sensor positioning platform, in accordance with some examples;

DETAILED DESCRIPTION

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

The disclosed technologies address a need in the art for improvements in vehicle sensor technologies and capabilities. In some examples, a sensor positioning platform on an autonomous vehicle can include multiple co-located sensors that can be dynamically rotated or repositioned for optimal sensor coverage. The sensors can be mounted on a rotating sensor carrier structure of the sensor positioning platform, which functions as an azimuth positioning stage for the sensors. The sensor positioning platform can include a motor for moving, repositioning, and/or rotating the sensors and sensor carrier structure, and electrical components for controlling the movement, repositioning, and/or rotation of the sensors and sensor carrier structure through the motor. The sensor positioning platform can also include a sensor cleaning system that allows the sensors in the rotating sensor carrier structure to be cleaned as needed, a cable management system that interconnects the sensors with other electrical components of the autonomous vehicle and provides a freedom of movement that enables the sensors to remain connected when rotating, and other components as described herein.

The sensor positioning platform can receive (e.g., from a computing system on the autonomous vehicle) commands for moving, repositioning, and/or rotating the sensors and sensor carrier structure. Thus, through the sensor positioning platform, the sensors can be repositioned to increase sensor coverage, provide instantaneous field of view, and target specific areas or objects. The sensors can also be repositioned to account for changes in the vehicle's motion, driving angles and direction, as well as relative changes in the vehicle's environment and the motion, angle, and position of surrounding objects. The dynamic and adaptable sensor repositioning herein can improve the sensors' visibility, accuracy, and detection capabilities. The sensor repositioning platform can allow autonomous vehicles to monitor their surroundings and obtain a robust understanding of their environment. The sensor repositioning platform and associated functionality can also provide benefits in cost, sensor data redundancy, and sensor fusion.

Figure 1:
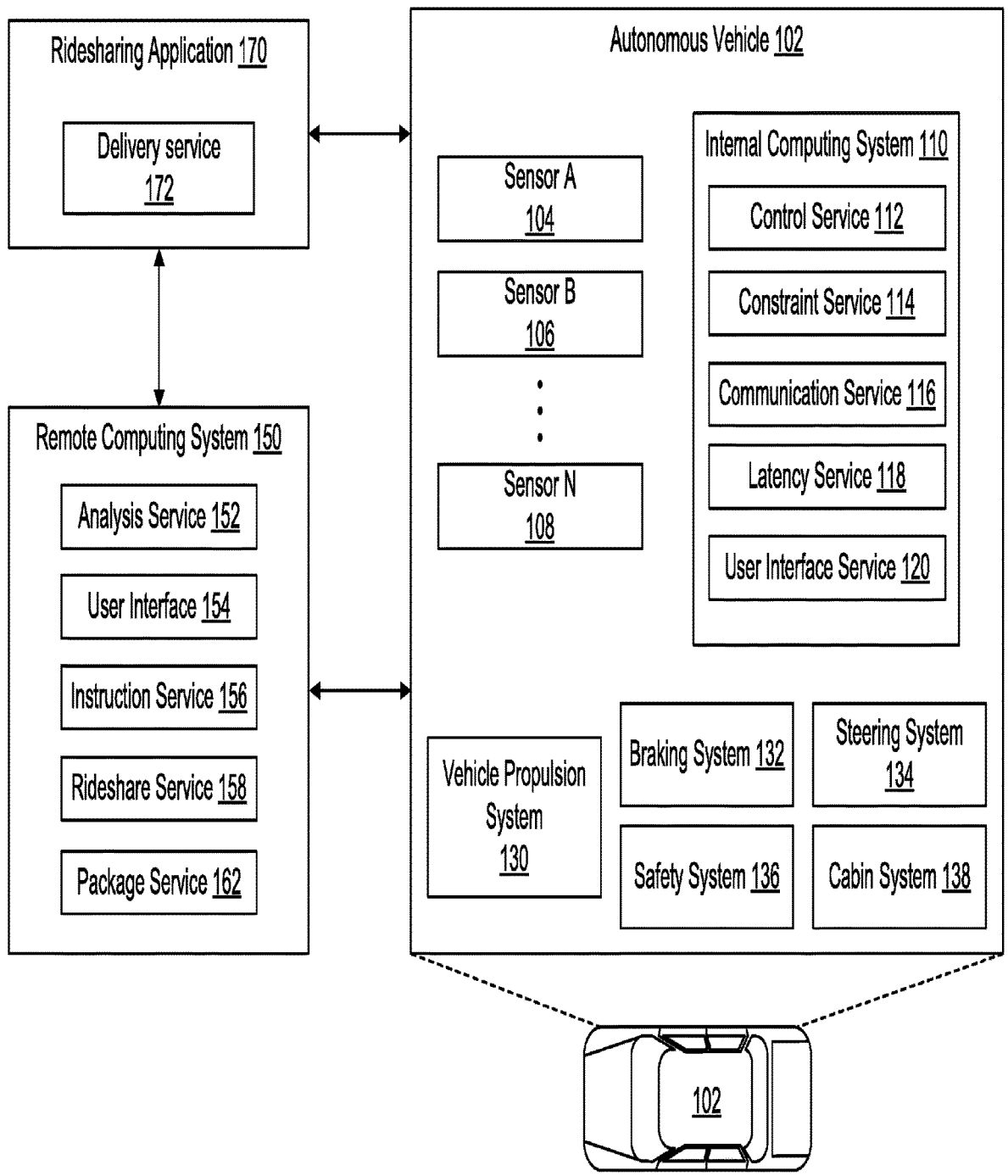
FIG. 1 illustrates an example autonomous vehicle environment including a computing system in communication with an autonomous vehicle.

FIG. 1 illustrates an example autonomous vehicle environment 100. The example autonomous vehicle environment 100 includes an autonomous vehicle 102, a remote computing system 150, and a ridesharing application 170. The autonomous vehicle 102, remote computing system 150, and ridesharing application 170 can communicate with each other over one or more networks, such as a public network (e.g., a public cloud, the Internet, etc.), a private network (e.g., a local area network, a private cloud, a virtual private network, etc.), and/or a hybrid network (e.g., a multi-cloud or hybrid cloud network, etc.).

The autonomous vehicle 102 can navigate about roadways without a human driver based on sensor signals generated by sensors 104-108 on the autonomous vehicle 102. The sensors 104-108 on the autonomous vehicle 102 can include one or more types of sensors and can be arranged about the autonomous vehicle 102. For example, the sensors 104-108 can include, without limitation, one or more inertial measuring units (IMUs), one or more image sensors (e.g., visible light image sensors, infrared image sensors, video camera sensors, surround view camera sensors, etc.), one or more light emitting sensors, one or more global positioning system (GPS) devices, one or more radars, one or more light detection and ranging sensors (LIDARs), one or more sonars, one or more accelerometers, one or more gyroscopes, one or more magnetometers, one or more altimeters, one or more tilt sensors, one or more motion detection sensors, one or more light sensors, one or more audio sensors, etc. In some implementations, sensor 104 can be a radar, sensor 106 can be a first image sensor (e.g., a visible light camera), and sensor 108 can be a second image sensor (e.g., a thermal camera). Other implementations can include any other number and type of sensors.

The autonomous vehicle 102 can include several mechanical systems that are used to effectuate motion of the autonomous vehicle 102. For instance, the mechanical systems can include, but are not limited to, a vehicle propulsion system 130, a braking system 132, and a steering system 134. The vehicle propulsion system 130 can include an electric motor, an internal combustion engine, or both. The braking system 132 can include an engine brake, brake pads, actuators, and/or any other suitable componentry configured to assist in decelerating the autonomous vehicle 102. The steering system 134 includes suitable componentry configured to control the direction of movement of the autonomous vehicle 102 during navigation.

The autonomous vehicle 102 can include a safety system 136. The safety system 136 can include lights and signal indicators, a parking brake, airbags, etc. The autonomous vehicle 102 can also include a cabin system 138, which can include cabin temperature control systems, in-cabin entertainment systems, etc.

The autonomous vehicle 102 can include an internal computing system 110 in communication with the sensors 104-108 and the systems 130, 132, 134, 136, and 138. The internal computing system 110 includes one or more processors and at least one memory for storing instructions executable by the one or more processors. The computer-executable instructions can make up one or more services for controlling the autonomous vehicle 102, communicating with remote computing system 150, receiving inputs from passengers or human co-pilots, logging metrics regarding data collected by sensors 104-108 and human co-pilots, etc.

The internal computing system 110 can include a control service 112 configured to control operation of the vehicle propulsion system 130, the braking system 132, the steering system 134, the safety system 136, and the cabin system 138. The control service 112 can receive sensor signals from the sensors 104-108 can communicate with other services of the internal computing system 110 to effectuate operation of the autonomous vehicle 102. In some examples, control service 112 may carry out operations in concert with one or more other systems of autonomous vehicle 102.

The internal computing system 110 can also include a constraint service 114 to facilitate safe propulsion of the autonomous vehicle 102. The constraint service 116 includes instructions for activating a constraint based on a rule-based restriction upon operation of the autonomous vehicle 102. For example, the constraint may be a restriction on navigation that is activated in accordance with protocols configured to avoid occupying the same space as other objects, abide by traffic laws, circumvent avoidance areas, etc. In some examples, the constraint service 114 can be part of the control service 112.

The internal computing system 110 can also include a communication service 116. The communication service 116 can include software and/or hardware elements for transmitting and receiving signals to and from the remote computing system 150. The communication service 116 can be configured to transmit information wirelessly over a network, for example, through an antenna array or interface that provides cellular (long-term evolution (LTE), $3^{rd}$ Generation (3G), $5^{th}$ Generation (5G), etc.) communication.

In some examples, one or more services of the internal computing system 110 are configured to send and receive communications to remote computing system 150 for reporting data for training and evaluating machine learning algorithms, requesting assistance from remote computing system 150 or a human operator via remote computing system 150, software service updates, ridesharing pickup and drop off instructions, etc.

The internal computing system 110 can also include a latency service 118. The latency service 118 can utilize timestamps on communications to and from the remote computing system 150 to determine if a communication has been received from the remote computing system 150 in time to be useful. For example, when a service of the internal computing system 110 requests feedback from remote computing system 150 on a time-sensitive process, the latency service 118 can determine if a response was timely received from remote computing system 150, as information can quickly become too stale to be actionable. When the latency service 118 determines that a response has not been received within a threshold period of time, the latency service 118 can enable other systems of autonomous vehicle 102 or a passenger to make decisions or provide needed feedback.

The internal computing system 110 can also include a user interface service 120 that can communicate with cabin system 138 to provide information or receive information to a human co-pilot or passenger. In some examples, a human co-pilot or passenger can be asked or requested to evaluate and override a constraint from constraint service 114. In other examples, the human co-pilot or passenger may wish to provide an instruction to the autonomous vehicle 102 regarding destinations, requested routes, or other requested operations.

As described above, the remote computing system 150 can be configured to send and receive signals to and from the autonomous vehicle 102. The signals can include, for example and without limitation, data reported for training and evaluating services such as machine learning services, data for requesting assistance from remote computing system 150 or a human operator, software service updates, rideshare pickup and drop off instructions, etc.

The remote computing system 150 can include an analysis service 152 configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, images, sounds reported from the autonomous vehicle 102 to an operator of remote computing system 150, maps, routes, navigation data, notifications, user data, vehicle data, software data, and/or any other content. User interface service 154 can receive, from an operator, input instructions for the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing applications 170 operating on computing devices, such as tablet computers, laptop computers, smartphones, head-mounted displays (HMDs), gaming systems, servers, smart devices, smart wearables, and/or any other computing devices. In some cases, such computing devices can be passenger computing devices. The rideshare service 158 can receive from passenger ridesharing app 170 requests, such as user requests to be picked up or dropped off, and can dispatch autonomous vehicle 102 for a requested trip.

The rideshare service 158 can also act as an intermediary between the ridesharing app 170 and the autonomous vehicle 102. For example, rideshare service 158 can receive from a passenger instructions for the autonomous vehicle 102, such as instructions to go around an obstacle, change routes, honk the horn, etc. The rideshare service 158 can provide such instructions to the autonomous vehicle 102 as requested.

The remote computing system 150 can also include a package service 162 configured to interact with the ridesharing application 170 and/or a delivery service 172 of the ridesharing application 170. A user operating ridesharing application 170 can interact with the delivery service 172 to specify information regarding a package to be delivered using the autonomous vehicle 102. The specified information can include, for example and without limitation, package dimensions, a package weight, a destination address, delivery instructions (e.g., a delivery time, a delivery note, a delivery constraint, etc.), and so forth.

The package service 162 can interact with the delivery service 172 to provide a package identifier to the user for package labeling and tracking. Package delivery service 172 can also inform a user of where to bring their labeled package for drop off. In some examples, a user can request the autonomous vehicle 102 come to a specific location, such as the user's location, to pick up the package. While delivery service 172 has been shown as part of the ridesharing application 170, it will be appreciated by those of ordinary skill in the art that delivery service 172 can be its own separate application.

One beneficial aspect of utilizing autonomous vehicle 102 for both ridesharing and package delivery is increased utilization of the autonomous vehicle 102. Instruction service 156 can continuously keep the autonomous vehicle 102 engaged in a productive itinerary between rideshare trips by filling what otherwise would have been idle time with productive package delivery trips.

Figure 2:
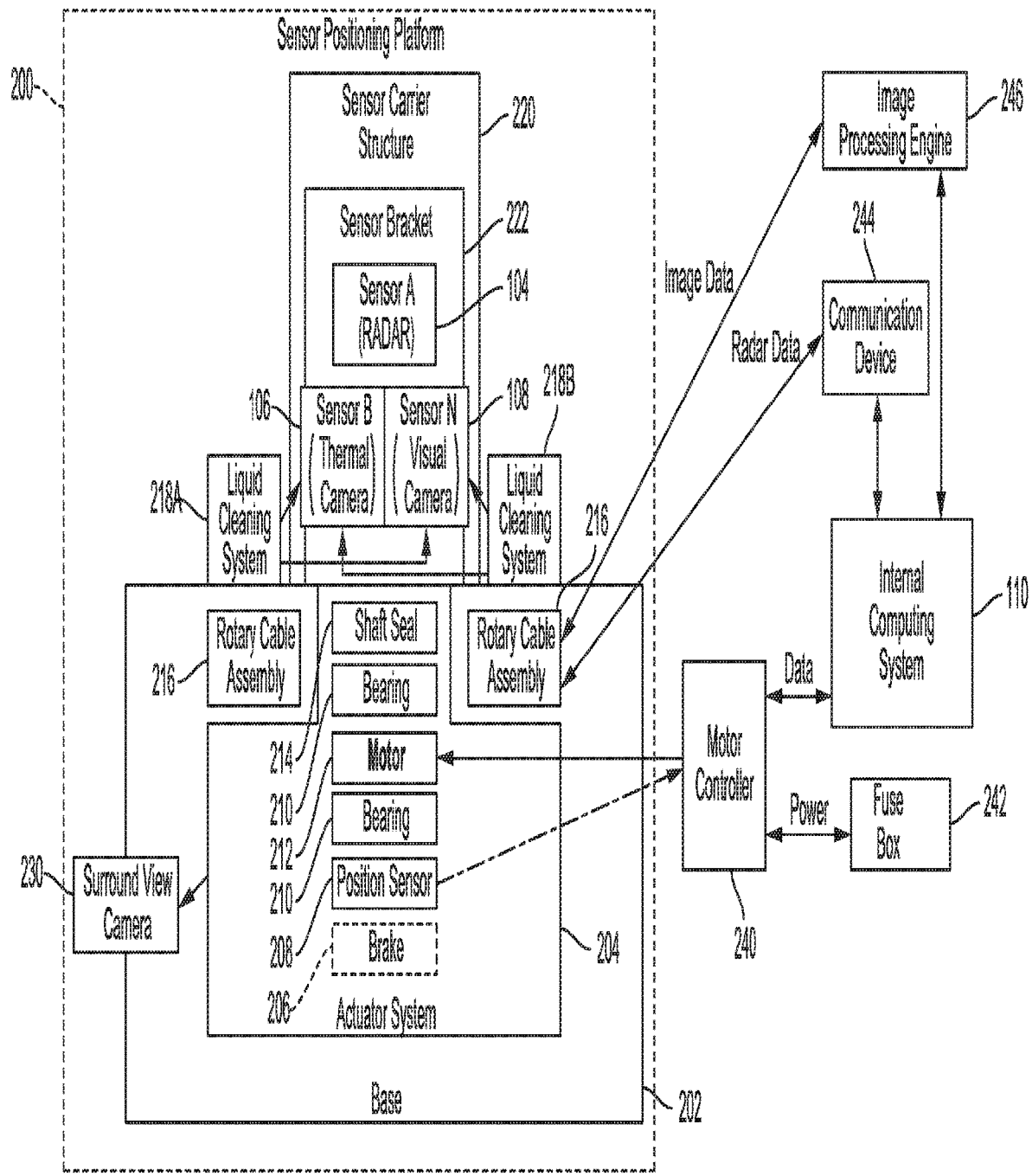
FIG. 2 is a block diagram of an example sensor positioning platform for mechanically moving, rotating, and/or positioning a payload of sensors on an autonomous vehicle, in accordance with some examples.

FIG. 2 is a block diagram of an example sensor positioning platform 200 for mechanically moving, rotating, and/or positioning sensors 104-108 on a sensor carrier structure 220 implemented by the autonomous vehicle 102. The sensor positioning platform 200 can be attached to, coupled with, and/or otherwise secured to the autonomous vehicle 102. The sensor carrier structure 220 with the sensors 104-108 can be situated outside of the autonomous vehicle 102 in order to have access to, and/or visibility into, the external or outside environment (e.g., outside or external to the autonomous vehicle 102) so the sensors 104-108 can capture sensor data or measurements pertaining to the outside environment, conditions or characteristics of the outside environment, objects or humans located in the outside environment, etc.

In addition to providing the sensors 104-108 access to, and/or visibility into, the external or outside environment, as further described herein, the sensor positioning platform 200 can mechanically move, rotate, and/or reposition the sensor carrier structure 220 to allow the sensors 104-108 on the sensor carrier structure 220 to capture sensor data or measurements for different areas or regions of the outside environment, extend the addressable field of regard, extend and/or provide an instantaneous field of view, provide sensor visibility or access into a focused or specific area or object, account for different angles, account for different vehicle maneuvers, etc. The sensor data or measurements can be used to detect objects (e.g., other vehicles, obstacles, traffic signals, signs, etc.), humans, animals, conditions (e.g., weather conditions, visibility conditions, traffic conditions, road conditions, etc.), route or navigation conditions, and/or any other data or characteristics associated with the outside environment.

In some examples, the autonomous vehicle 102 can use the sensor data or measurements to perform (or when performing) one or more operations, such as mapping operations, tracking operations, navigation or steering operations, safety operations, braking operations, maneuvers, etc. For example, the autonomous vehicle 102 can use the sensor data or measurements to gain insight or visibility into the outside environment and the outside environment conditions. The autonomous vehicle 102 can then use such insight when making navigation decisions, such as determining a velocity, determining a maneuver, determining how to avoid an object, determining a trajectory, determining navigation changes (e.g., changes in position, velocity, angle, direction, etc.), and so forth.

The sensor positioning platform 200 can include a base 202. The base 202 can include an actuator system 204 and one or more rotary cable assemblies 216. Moreover, the one or more rotary cable assemblies 216 can include power and/or communication lines (e.g., cables, wires, flexible printed circuits, etc.) for supplying power to the sensors 104-108 on the sensor carrier structure 220 and carrying data to and/or from the sensors 104-108.

In some examples, the one or more rotary cable assemblies 216 can feed power and communication lines to the sensors 104-108 for powering the sensors 104-108 and communicatively connecting (directly or indirectly) the sensors 104-108 to the internal computing system 110 and/or the actuator system 204, while allowing the sensors 104-108 to have freedom of movement in order to rotate with the sensor carrier structure 220 while receiving power and remaining communicatively connected to the internal computing system 110 and/or the actuator system 204.

In some cases, the one or more rotary cable assemblies 216 can include data lines that connect the sensors 104-108 to a communications device 244 and/or an image processing engine 246. The data lines can allow the sensors 104-108 to communicate with the communications device 244 to send and receive data signals (e.g., sensor data, instructions, commands, information, etc.) to and from the communications device 244. Moreover, the data lines can allow image sensors (106, 108) on the sensor carrier structure 220 to provide, to the image processing engine, image data (e.g., images, videos, frames, etc.) captured by such image sensors.

The communications device 244 can include, for example and without limitation, a network interface, a switch, a hub, a relay/proxy, or any other network device capable of switching, forwarding, and/or routing data. In some implementations, the communications device 244 can support network communications over or across one or more networks, such as a private network (e.g., a LAN), a public network (e.g., a WAN, a cloud network, etc.), a hybrid network, etc. For example, the communications device 244 can support wireless communications, such as cellular communications, WIFI communications, etc.; wired or cable communications, such as Ethernet communications, fiber optic communications, etc.; and/or any other type of communications.

The communications device 244 can be communicatively connected with the internal computing system 110 and/or any other computing device, and can thus send and/or receive data to and/or from the internal computing system 110 and/or any other computing devices. Thus, the communications device 244 can route or forward data between the sensors 104-108 and the internal computing system 110 (or any other computing device). Moreover, in some cases, the communications device 244 can be part of, or implemented by, the internal computing system 110.

The image processing engine 246 can be part of, or implemented by, the internal computing system 110 or a separate computing device. Moreover, in some cases, the image processing engine 246 can be part of, or implemented by, a same computing system as the communications device 244. For example, both the image processing engine 246 and the communications device 244 can be part of, or implemented by, the internal computing system 110 or a separate computing device.

The image processing engine 246 can receive image data (e.g., images, frames, videos, etc.) from image sensors (e.g., 106, 108) on the sensor carrier structure 220 and perform one or more image processing and/or pre-processing operations on the image data, such as, for example and without limitation, filtering, scaling, sub-sampling, color correction, color conversion, geometric transformations, noise reduction, demosaicing, spatial filtering, image restoration, image enhancement, frame rate conversion (e.g., up-conversion, down-conversion), segmentation, feature extraction, etc. The image processing engine 246 can then provide the processed image data to the internal computing system 110 for further use, processing, analysis, etc.

The actuator system 204 can be configured to control a position, angle, and/or movement of the sensor carrier structure 220 and the sensors 104-108 on the sensor carrier structure 220. For example, the actuator system 204 can include a motor 212 for controlling the positioning, rotation, and/or movement of the sensor carrier structure 220 hosting the sensors 104-108, as further described herein. The motor 212 on the actuator system 204 can receive, from a motor controller 240, a command instructing the motor 212 to move or rotate the sensor carrier structure 220 with the sensors 104-108 to a specific angle and/or position in order to change the angle, position, and/or field-of-view (FOV) of the sensors 104-108 on the sensor carrier structure 220.

In some examples, the motor 212 can be an electrical motor capable of converting electrical energy into mechanical energy that the motor 212 can use to move the sensor carrier structure 220 and the sensors 104-108 in the sensor carrier structure 220. In some implementations, the motor 212 can be a gimbal motor. Moreover, the motor controller 240 can include one or more electronic circuits (e.g., one or more microprocessors, microcontrollers, central processing units (CPUs), graphics processing units (GPUs), digital signal processors (DSPs), and/or any other suitable electronic circuits or hardware), and/or can include and/or can be implemented using computer software, firmware, or any combination thereof, to perform the various operations described herein.

In some examples, the motor controller 240 can include one or more computing and/or electronic components, such as one or more CPUs, Input/Output (I/O) ports or peripherals, timers, memories (e.g., electrically erasable programmable read-only memory (EEPROM), read-only memory (ROM), random-access memory, and the like), controllers, processors, storage devices, and/or any other electronic circuits or hardware. Moreover, the motor controller 240 can include memory (not shown), such as EEPROM, for storing data, firmware, software, and/or any combination thereof.

The motor controller 240 can send control signals to the motor 212 to move, rotate, and/or control the motor 212, which can then move, rotate, and/or position the sensor carrier structure 220 with the sensors 104-108 to a specific position, angle, and/or location. In some cases, the motor controller 240 can generate the control signals based on, and/or in response to, one or more commands or instructions received by the motor controller 240 from the internal computing system 110 on the autonomous vehicle 102. For example, the internal computing system 110 can send commands or instructions to the motor controller 240 for mechanically moving, rotating, and/or positioning the sensor carrier structure 220 with the sensors 104-108 and/or the motor 212 on the sensor positioning platform 200. The motor controller 240 can receive such commands or instructions, parse the commands or instructions, generate one or more control signals based on the commands or instructions, and send the one or more control signals to the motor 212 on the actuator system 204, which can cause the motor 212 to move the sensor carrier structure 220 with the sensors 104-108 to a specific position, angle, and/or location.

In some cases, when generating control signals, the motor controller 240 can calculate a difference between a requested position (e.g., specified in the commands or instructions received from the internal computing system 110) of the motor 212 (and the sensor carrier structure 220 with the sensors 104-108) and an actual or current position of the motor 212 (and the sensor carrier structure 220 with the sensors 104-108). For example, the motor controller 240 can obtain sensor data from a position sensor 208 in the actuator system 204, which can include measurements of a current or actual position of the motor 212, and use such measurements to determine a current or actual position of the motor 212. The motor controller 240 can use the current or actual position of the motor 212 to calculate an error or difference between the current or actual position of the motor 212 and the requested position for repositioning the motor 212 (and the sensor carrier structure 220 with the sensors 104-108).

The motor controller 240 can then use the calculated error or difference to make any adjustments to the position defined in the one or more control signals for the motor 212. In some cases, the motor controller 240 can continuously receive position measurements from the position sensor 208 to calculate such errors or differences, and make adjustments to the position specified in the control signals to the motor 212. This way, the motor controller 240 can fine tune the position specified in the control signals to the motor 212 to account for any such errors and increase an accuracy of the position adjustments of the motor 212 (and the sensor carrier structure 220 of sensors 104-108).

The position sensor 208 used to obtain position measurements for the motor 212 can include one or more sensor devices, which can include any type of sensor, encoder, transducer, detector, transmitter, and/or sensing component capable of measuring the position (e.g., linear, angular, etc.) and/or change of position of a target or object, such as the motor 212. Non-limiting examples of position sensors (208) that can be used to obtain position measurements (e.g., displacement, linear position, angular position, etc.) for the motor 212 include optical encoders, potentiometers, magnetic position sensors (e.g., Hall effect sensors, magnetor- estrictive position sensors, etc.), rotary encoders, linear encoders, capacitive position sensors, inductive position sensors (e.g., resolvers, linearly variable differential transformers, etc.), fiber-optic position sensors, photodiode arrays, incoders, etc. These examples are not exhaustive and are simply provided for explanation purposes, as any other types of position sensors are also contemplated herein.

The position sensor 208 can reside under the motor 212, along an outside of the motor 212, along an outside of a rotor of the motor 212, along an outside of a stator of the motor 212, and/or in any other location that allows the position sensor 208 to obtain positioning measurements for the motor 212 and fit within an assembly (e.g., 202) of the actuator system 204. For example, in some implementations, the position sensor 208 can determine the position of the motor 212 using a multi-pole magnetic strip. The multi-pole magnetic strip can be located on an outside of the motor 212, a rotor of the motor 212, a stator of the motor 212, and/or any other location that allows the multi-pole magnetic strip to determine the position of the motor 212. In some cases, the multi-pole magnetic strip can sit flush along the outside of the rotor of the motor 212.

In some examples, when generating control signals for the motor 212, the motor controller 240 can translate the control signals into a format and power level that can move the motor 212 to a specific position. The specific position can be defined in the one or more control signals as previously explained. The motor controller 240 can transmit the translated signals to the motor 212 in order to move the motor 212 to the specific position. Based on the translated signal from the motor controller 240, the motor 212 can move the sensor carrier structure 220 containing the sensors 104-108 in order to move or reposition the sensors 104-108 to the specific position.

In some examples, the motor controller 240 can be electrically coupled with a fuse box 242. The fuse box 242 can control the electrical flow and power to the motor controller 240. Moreover, the motor controller 240 can be communicatively connected to the internal computing system 110. The internal computing system 110 and the motor controller 240 can thus communicate data (e.g., instructions, commands, signals, sensor data, motor repositioning data, requests, information, content, etc.) to each other. In some cases, the motor controller 240 can send and/or receive data (e.g., instructions, commands, signals, sensor data, motor repositioning data, requests, information, content, etc.) to and/or from other devices through the internal computing system 110. For example, the motor controller 240 can send and/or receive data from sensors (e.g., 104-108), a remote computing system (e.g., 150), and/or any other remote device or location, through the internal computing system 150. Here, the internal computing system 150 can relay such data to and/or from the motor controller 240. In other cases, the motor controller 240 can communicate directly (or without going through the internal computing system 110) with other remote devices or locations.

In some examples, the motor controller 240 can include a communication interface that supports network communications to allow the motor controller 240 to communicate over one or more networks, such as a private network (e.g., a LAN), a public network (e.g., a WAN, a cloud network, etc.), a hybrid network, etc. For example, the motor controller 240 can include a communication interface that supports wireless communications, such as cellular communications, WIFI communications, etc.; wired or cable communications, such as Ethernet communications, fiber optic communications, etc.; and/or any other type of communications.

The sensor carrier structure 220 can be attached, coupled, or otherwise secured to the base 202 in a manner that allows the sensor carrier structure 220 to rotate and/or move relative to the base 202. Moreover, the sensors 104-108 can be attached, coupled, fixed, or otherwise secured to the sensor carrier structure 220 via a coupling or securing component, such as a sensor bracket 222. In some examples, the sensors 104-108 can be co-located on the sensor carrier structure 220. Thus, by moving or repositioning the sensor carrier structure 220, the motor 212 can also move or reposition the sensors 104-108 on the sensor carrier structure 220. Also, by affixing and/or co-locating the sensors 104-108 on the sensor carrier structure 220, any need to calibrate the sensors 104-108 or monitor their relative position can be reduced or eliminated, as the position (actual and relative) of the sensors 104-108 can be fixed and known.

The sensor carrier structure 220 can include, for example and without limitation, an articulating or positioning stage, frame, or platform for the sensors 104-108. For example, the sensor carrier structure 220 can be an azimuth positioning stage for the sensors 104-108. Moreover, in some examples, the sensor carrier structure 220 can be attached, coupled, fixed or otherwise secured to the actuator system 204.

In some cases, the base 202 and/or the sensor carrier structure 220 can be attached, coupled, fixed, placed, or otherwise secured to an external portion of the autonomous vehicle 102 to provide the sensors 104-108 access to, and/or visibility into, the outside or external environment. For example, the base 202 and the sensor carrier structure 220 can be securely placed on a pillar, such as an A-pillar, of the autonomous vehicle 102. In this example, the base 202 and the sensor carrier structure 202 can reside on an outside of the autonomous vehicle 102 between the windshield, the hood of the autonomous vehicle 102, and the passenger or driver's side. Thus, the sensors 104-108 can reside outside of the autonomous vehicle 102 and have access to, and/or visibility into, the outside or external environment.

In other cases, a portion of the base 202 and/or the sensor carrier structure 220 can be attached, coupled, fixed, placed, or otherwise secured to an internal portion of the autonomous vehicle 102, with another portion of the base 202 and/or the sensor carrier structure 220 extending, extruding, protruding, projecting and/or sticking out from the autonomous vehicle 102 to an outside of the autonomous vehicle 102. This way, the sensors 104-108 can reside outside of the autonomous vehicle 102 and thus have access to, and/or visibility into, the outside or external environment.

The motor 212 can move the sensor carrier structure 220 and the sensors 104-108 any number of times as previously described, in order to adjust the position or angle of the sensors 104-108 as desired and thus the visibility and/or coverage of the sensors 104-108. For example, the motor 212 can move the sensor carrier structure 220 and the sensors 104-108 as requested, periodically (e.g., at specific or random time intervals), randomly, and/or in response to one or more events, such as a maneuver of the autonomous vehicle 102, a change in position or motion of the autonomous vehicle 102, a detected human or object (e.g., another vehicle, a traffic sign, an object on the road, a guardrail, etc.), a detected condition (e.g., a condition of the autonomous vehicle 102, a condition of the external environment, a traffic condition, a road condition, a safety condition or threat, etc.), a navigation instruction, a predicted navigation event, etc.

The actuator system 204 can include bearings 210 to support movement of, and reduce friction between, one or more moving parts of the motor 212, such as a rotor and a stator. The bearings 210 can also provide increased axial, radial, and moment load capacity to the motor 212. Moreover, the bearings 210 can be in contact with one or more elements or portions of the motor 212, as further described herein.

In some examples, the actuator system 204 can also include a shaft seal 214 to seal rotary elements (and/or elements in relative motion) in the actuator system 204, such as the motor 212, a shaft of the motor 212, a rotor of the motor 212, a rotating bore of the motor 212, etc. In some cases, the shaft seal 214 can be located between the sensor carrier structure 220 and the actuator system 204. In other cases, the shaft seal 214 can be located between the actuator system 204 and the base 202 and/or between the sensor carrier structure 220 and the base 202.

In some implementations, the actuator system 204 can optionally include a brake 206. The brake 206 can be configured to hold and/or control a movement of the motor 212. In some cases, the brake 206 can be configured to control and/or manage a holding torque of the motor 212. Moreover, in some examples, the brake 206 in the actuator system 204 can be implemented below the motor 212 and the position sensor 208.

In some implementations, the base 202 can house the actuator system 204 and the rotary cable assembly 216 and can have a small and/or cylindrical form factor. In other examples, the base 202 can have any other size, shape or design. Moreover, the base 202 can have one or more hollow sections, such as a hollow shaft, for cables to pass through (e.g., from the bottom and through the middle of the assembly) the assembly to the rotary cable assembly 216, to the top of the base 202, and/or to the sensors 104-108 on the sensor carrier structure 220.

In some cases, one or more of the electronic components or hardware in the base 202 and/or the actuator system 204 can be implemented by one or more printed circuit boards (PCBs) or electronic circuits. Moreover, in some examples, the base 202 and/or the actuator system 204 can include a memory or storage device for storing data, a power supply for powering electronic components, a communication interface for communicating with other devices, and/or one or more processing components.

In some implementations, the sensor positioning platform 200 can include a surround view camera 230. The surround view camera 230 can be included in, mounted on, coupled with, or otherwise secured to the base 202 of the sensor positioning platform 200. In some cases, the sensor positioning platform 200 can also include cleaning systems 218A-B for cleaning one or more of the sensors 104-108 on the sensor carrier structure 220. For example, the sensor positioning platform 200 can include a liquid cleaning system 218A and an air cleaning system 218B for using liquid and air to clean image sensors (e.g., 106, 108) on the sensor carrier structure 220. The liquid cleaning system 218A and the air cleaning system 218B can each include a discharge element such as a nozzle, vent, or spraying device for controlling and enabling the flow, discharge, and/or projection of liquid and/or air to the sensors on the sensor carrier structure 220.

The liquid cleaning system 218A and the air cleaning system 218B can also include a hose, pipe, tube, enclosed chamber, or enclosed carrier element, which can be attached, coupled, connected, affixed, or secured to the discharge element and can carry, provide, and/or direct liquid and air to the liquid cleaning system 218A and the air cleaning system 218B. The discharge elements in the liquid cleaning system 218A and the air cleaning system 218B can receive liquid and air from their respective hoses, pipes, tubes, enclosed chambers, or enclosed carrier elements, and can output (e.g., discharge, spray and/or project) the received liquid and air towards sensors on the sensor carrier structure 220 in order to clean those sensors.

In some implementations, the liquid cleaning system 218A and the air cleaning system 218B can be positioned on a stationary portion of the sensor positioning platform 200, such as a stationary portion of the base 202, as further described herein. The liquid cleaning system 218A and air cleaning system 218B can output the liquid and air when the sensors 104-108 on the sensor carrier structure 220 move or rotate within an output range of the liquid cleaning system 218A and air cleaning system 218B. In some examples, the liquid cleaning system 218A and air cleaning system 218B can output the liquid and air as sensors rotate or move within an output range.

In other examples, the actuator system 204 can move the sensors (e.g., by moving the sensor carrier structure 220) within an output range of the liquid cleaning system 218A and air cleaning system 218B when a sensor cleaning operation is to be performed. In some cases, the actuator system 204 can also move or rotate such sensors several times within a range of the liquid cleaning system 218A and air cleaning system 218B to change the positioning of the sensors, increase a coverage of the cleaning liquid and air on the sensors and/or ensure optimal cleaning of the sensors.

In other implementations, the liquid cleaning system 218A and air cleaning system 218B can be positioned on a rotating portion of the sensor positioning platform 200, such as the sensor carrier structure 220, as further described herein. The liquid cleaning system 218A and the air cleaning system 218B can be positioned on the rotating portion at a respective location relative to the sensors 104-108 on the sensor carrier structure 220. The respective location can be within an output range that allows liquid and air outputted by the liquid cleaning system 218A and air cleaning system 218B to reach and clean sensors on the sensor carrier structure 220.

In some examples, the motor controller 240, the fuse box 242, the communications device 244, and/or the image processing engine 246 described above can be part of, or implemented by, the sensor positioning platform 200. In other examples, the motor controller 240, the fuse box 242, the communications device 244, and/or the image processing engine 246 described above can be separate from the sensor positioning platform 200.

While the sensor positioning platform 200 and the actuator system 204 are shown in FIG. 2 to include certain components, one of ordinary skill will appreciate that the sensor positioning platform 200 and/or the actuator system 204 can include more or fewer components than those shown in FIG. 2. For example, in some instances, the sensor positioning platform 200 and/or the actuator system 204 can include one or more different or additional components such as one or more memory components (e.g., one or more RAMs, ROMs, caches, buffers, and/or the like), one or more processing devices that are not shown in FIG. 2, one or more transistors, one or more data communication components (e.g., network interfaces, communication devices, antennas, etc.), one or more storage devices (e.g., one or more hard drives, one or more solid-state drives, and/or the like), one or more circuits that are not shown in FIG. 2, one or more sensors that are not shown in FIG. 2, and/or any other electronic or mechanical component.

Figure 3A:
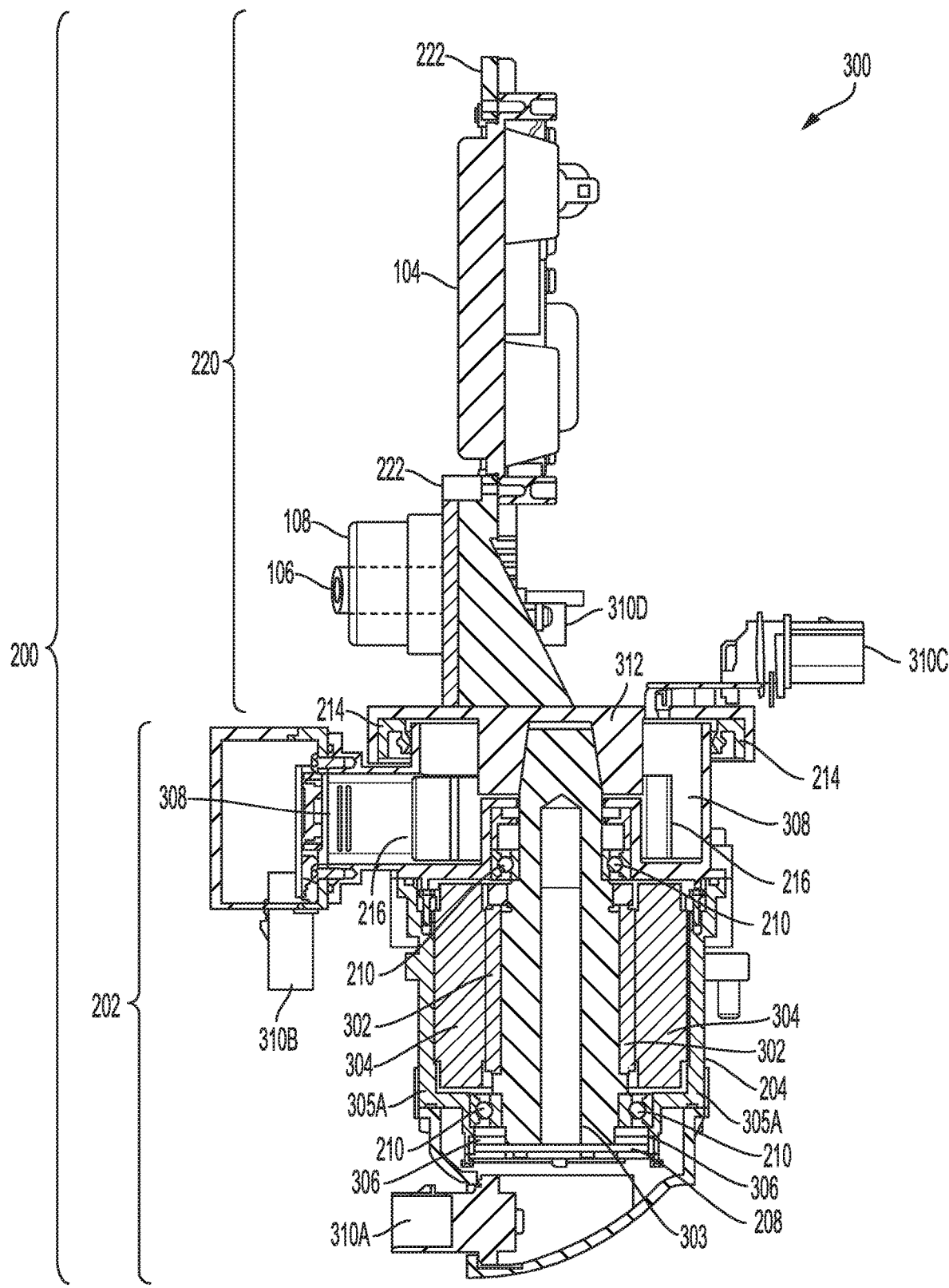
FIG. 3A illustrates an example configuration of a sensor positioning platform, in accordance with some examples.

FIG. 3A illustrates an example configuration 300 of a sensor positioning platform 200. The configuration 300 in this example is depicted in a cutaway view showing an interior of the base 202. As shown, the sensor positioning platform 200 can include the sensor carrier structure 220, which includes or contains the sensors 104-108; and the base 202, which includes or houses the actuator system 204.

The sensor carrier structure 220 can include the sensors 104-108, a sensor bracket 222 for holding, securing, affixing, and/or restraining the sensors 104-108 to the sensor carrier structure 220, and one or more connector elements 310C, 310D for providing power and/or data connectivity to the sensors 104-108 on the sensor carrier structure 220. The one or more connector elements 310C, 310D can connect to one or more connector elements on the rotary cable assembly 216 to provide power and/or data connectivity to the sensors 104-108.

In some examples, the sensor bracket 222 can be secured, affixed, coupled, attached, and/or connected to a base 312, which provides a platform or stage for the sensor carrier structure 220. The base 312 can be moved and/or rotated by the actuator system 204, which can apply a force to the base 312 to move and/or rotate the base 312. As the base 312 is moved or rotated by the actuator system 204, the sensor carrier structure 220 and sensors 104-108 can move and/or rotate (e.g., relative to the base 202) along with the base 312.

The base 202 can include the actuator system 204 for moving, rotating, and/or repositioning the sensor carrier structure 220 and the sensors 104-108 on the sensor carrier structure 220. The base 202 can also include one or more rotary cable assemblies 216 and one or more housing structures 308 for the one or more rotary cable assemblies 216. The rotary cable assemblies 216 can include one or more electrical connectors which can connect to connector elements 310B and 310C to allow the rotary cable assemblies 216 to provide power and data connectivity to the sensors 104-108.

The actuator system 204 can include, without limitation, a rotor 302, a rotor shaft 303, a stator 304, a lower stator housing 305A, an upper stator housing 305B, a position sensor 208 or encoder, bearings 210, seals 214, and springs 306. In some cases, the actuator system 204 can include one or more other components such as, for example, a brake, a power supply, a controller, etc.

In some cases, the base 202 can include a securing element (not shown) for securing, attaching, coupling, or affixing the sensor positioning platform 200 to the autonomous vehicle 102. In some examples, the securing element can be a rotating or articulating element or member that can rotate, pivot, or reposition the base 202 (and thus the sensor carrier structure 220 and sensors 104-108) along an axis of rotation or motion such as a roll axis (e.g., Z axis).

In some examples, a portion, element or joint of the actuator system 204 and/or the base 202 can be attached, connected or coupled to the sensor carrier structure 220 (and/or to the base 312 of the sensor carrier structure 220) to allow the actuator system 204 to control the position, angle, orientation, and/or movement of the sensor carrier structure 220. For example, in some cases, a top portion of the actuator system 204, such as the rotor shaft 303 and/or the upper stator housing 305B, can interface with the base 312 of the sensor carrier structure 220 to enable the actuator system 204 to move and control the position, angle, orientation and/or movement of the sensor carrier structure 220 and the sensors 104-108 on the sensor carrier structure 220.

In some examples, the base 202 or a portion of the base 202 (e.g., a portion of the actuator system 204) can interface or connect to the sensor carrier structure 220 to allow the actuator system 204 on the base 202 to apply force to the sensor carrier structure 220 in order to move and/or rotate the sensor carrier structure 220 and the sensors 104-108. In other examples, the base 202 can have an opening that allows the sensor carrier structure 220 and the actuator system 204 or a portion of the actuator system 204 to make contact and/or be secured, coupled, connected, and/or attached to each other. Moreover, in some implementations, the sensor carrier structure 220 and the actuator system 204 can be connected, secured, attached, and/or coupled through, from, or at a top portion of the base 202. However, in other implementations, the sensor carrier structure 220 and the actuator system 204 can be connected, secured, attached, and/or coupled through, from, or at any other portion or location of the base 202.

As previously noted, the actuator system 204 can exert force (e.g., via the motor 212) on the sensor carrier structure 220 (or the base 312 of the sensor carrier structure 220) in order to adjust or control the position, angle, orientation, and/or movement of the sensor carrier structure 220. For example, the actuator system 204 can exert force on the base 312 of the sensor carrier structure 220 to rotate the sensor carrier structure 220 to a requested or specified position or angle. As the base 312 and the sensor carrier structure 220 rotate, the sensors 104-108 can also rotate with the base 312 and sensor carrier structure 220. Thus, such rotation of the base 312 and sensor carrier structure 220 can reposition the sensors 104-108 and adjust the orientation, position, field of view and/or coverage of the sensors 104-108.

The sensors 104-108 can be affixed, coupled, secured, connected, and/or attached to the sensor carrier structure 220 via the sensor bracket 222, such that the sensors 104-108 can move with the sensor carrier structure 220 when the sensor carrier structure 220 is rotated, repositioned, or otherwise moved by the actuator system 204. The sensor carrier structure 220 can thus serve as a positioning stage or platform for the sensors 104-108. For example, in some cases, the sensor carrier structure 220 can serve as an azimuth positioning stage for the sensors 104-108. Moreover, in some examples, the sensors 104-108 can be fixed or statically secured to the sensor carrier structure 220 such that the sensors 104-108 maintain the same (or substantially the same) location, position, angle, view, etc., relative to each other and the sensor carrier structure 220.

In some cases, the sensor carrier structure 220 can rotate along a horizontal or yaw axis (e.g., X axis) and thus can provide the sensors 104-108 rotational movement along the horizontal or yaw axis. In other cases, the sensor carrier structure 220 can rotate along various axes and thus can provide the sensors 104-108 multiple degrees of freedom. For example, in some cases, the sensor carrier structure 220 can rotate along a horizontal or yaw axis (e.g., X axis) and a vertical or pitch axis (e.g., Y axis) and thereby provide the sensors 104-108 rotational movement along the horizontal or yaw axis as well as the vertical or pitch axis. In some cases, the sensor carrier structure 220 can also extend up or down or otherwise move the sensors 104-108 up or down to adjust the altitude or height of the sensors 104-108.

In some examples, the base 202 can include hollow space to run air and/or liquid hoses through the base 202 and to liquid and/or air cleaning systems (e.g., 218A, 218B) that can output the air and/or liquid towards the sensors 104-108 in order to clean the sensors 104-108 on the sensor carrier structure 220. In some cases, the air and/or liquid cleaning systems can reside on a stationary portion of the sensor positioning platform 200, such as a portion of the base 202. The air and/or liquid cleaning systems can output air and/or liquid towards the sensors 104-108 and/or as the sensors 104-108 rotate within a distance or reach of the air and/or liquid cleaning systems. In other cases, the air and/or liquid cleaning systems can reside on a rotating portion of the sensor positioning platform 200, such as a portion of the base 312 of the sensor carrier structure 220. The air and/or liquid cleaning systems can thus rotate with the sensors 104-108 and can output air and/or liquid towards the sensors 104-108 at any time.

In some examples, such hollow space or bore in the base 202 can also be used to run sensor data and power cables through the base 202 and to the sensors 104-108 on the sensor carrier structure 220. In some cases, the hollow space or bore in the base 202 can be used to run the sensor data and power cables, as well as the air and/or liquid hoses, through the base 202. In other cases, the hollow space or bore in the base 202 can be used to run either the sensor data and power cables or the air and/or liquid hoses through the base 202.

In the example shown in FIG. 3A, the sensor carrier structure 220 includes a radar sensor 104, and two co-located image sensors 104-106, such as a visible light image sensor and an IR image sensor. However, it should be noted that this configuration is provided as a non-limiting example for explanation purposes, and other configurations are also contemplated herein. For example, in other configurations, the sensor carrier structure 220 can include more or less sensors than those shown in FIG. 3A, one or more different types of sensors than those shown in FIG. 3A, one or more of the same type of sensors as those shown in FIG. 3A, and/or a different combination or placement of sensors than that shown in FIG. 3A. To illustrate, in some examples, the sensor carrier structure 220 can include one or more image sensors (e.g., a visible light camera, an IR camera, etc.), one or more radars, and/or one or more other types of sensors such as LIDARs, IMUs, etc.

Figure 3B:
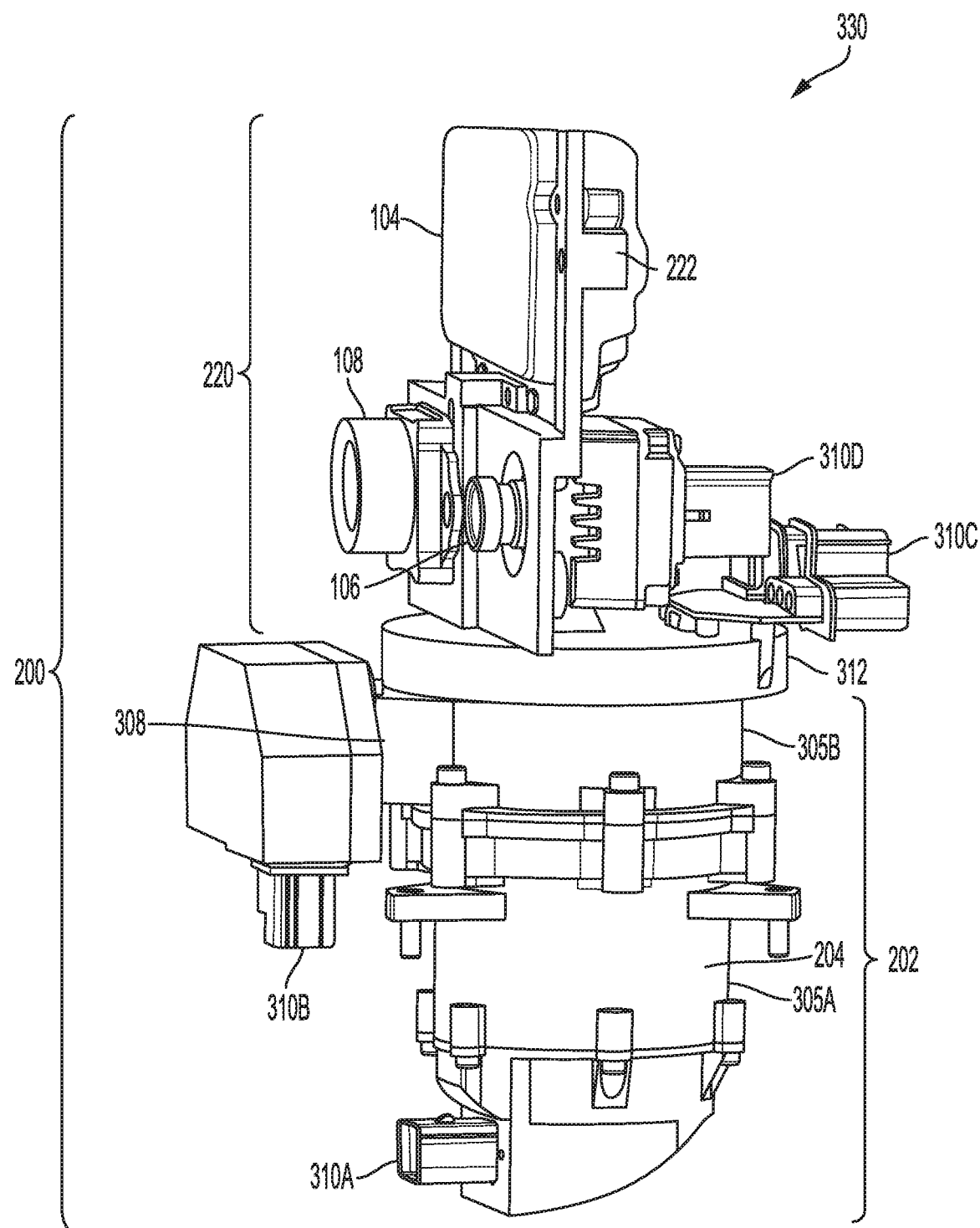
FIG. 3B illustrates an assembled view of the sensor positioning platform shown in FIG. 3A, in accordance with some examples.

FIG. 3B illustrates a view 330 of an example sensor positioning platform 200. The view 330 in this example is a side view depicting the base 202 shown in FIG. 3A, when assembled. As shown, the sensor positioning platform 200 can include the sensor carrier structure 220, which includes or contains the sensors 104-108; and the base 202, which includes the actuator system 204.

As shown, the sensors 104-108 on the sensor carrier structure 220 are secured or held by the sensor bracket 222. The sensor bracket 222 is secured, affixed, coupled, attached, and/or connected to the base 312, which provides a platform or stage for the sensor carrier structure 220. The base 312 can be moved and/or rotated by the actuator system 204, which can apply a force to the base 312 to move and/or rotate the base 312. As the base 312 is moved or rotated by the actuator system 204, the sensor carrier structure 220 and sensors 104-108 can move and/or rotate (e.g., relative to the base 202) along with the base 312.

The sensors 104-108 can connect to electrical connector (s) on the rotary cable assembly through connectors 310C, 310D, to obtain power and/or data connectivity. Each of the connectors 310C and 310D can include one or more connector elements. Moreover, as previously noted, the connectors 310C and 310D can connect to one or more electrical connectors on the rotary cable assembly 216, to provide power and/or data connectivity to the sensors 104-108. The housing structures 308 can house the rotary cable assemblies 216, and the rotary cable assemblies 216 can allow the sensors 104-108 to maintain connectivity even when moved or rotated, as further described herein.

The base 202 or a portion of the base 202 (e.g., a portion of the actuator system 204) can interface or connect to the sensor carrier structure 220 to allow the actuator system 204 on the base 202 to apply force to the sensor carrier structure 220 (and/or the base 312) in order to move and/or rotate the sensor carrier structure 220 (including the base 312) and the sensors 104-108. In other examples, the base 202 can have an opening that allows the sensor carrier structure 220 (e.g., through the base 312) and the actuator system 204 or a portion of the actuator system 204 to make contact and/or be secured, coupled, connected, and/or attached to each other. Moreover, in some implementations, the sensor carrier structure 220 and the actuator system 204 can be connected, secured, attached, and/or coupled through, from, or at a top portion of the base 202. However, in other implementations, the sensor carrier structure 220 and the actuator system 204 can be connected, secured, attached, and/or coupled through, from, or at any other portion or location of the base 202.

As previously noted, the actuator system 204 can exert force (e.g., via the motor 212) on the sensor carrier structure 220 (or the base 312 of the sensor carrier structure 220) in order to adjust or control the position, angle, orientation, and/or movement of the sensor carrier structure 220. For example, the actuator system 204 can exert force on the base 312 of the sensor carrier structure 220 to rotate the sensor carrier structure 220 to a requested or specified position or angle. As the base 312 and the sensor carrier structure 220 rotate, the sensors 104-108 can also rotate with the base 312 and sensor carrier structure 220. Thus, such rotation of the base 312 and sensor carrier structure 220 can reposition the sensors 104-108 and adjust the orientation, position, field of view and/or coverage of the sensors 104-108.

As previously noted, the sensors 104-108 can be affixed, coupled, secured, connected, and/or attached to the sensor carrier structure 220 via the sensor bracket 222, such that the sensors 104-108 can move with the sensor carrier structure 220 when the sensor carrier structure 220 is rotated, repositioned, or otherwise moved by the actuator system 204. In some cases, the sensor carrier structure 220 (including the base 312) can rotate along a horizontal or yaw axis (e.g., X axis) and thus can provide the sensors 104-108 rotational movement along the horizontal or yaw axis. In other cases, the sensor carrier structure 220 (including the base 312) can rotate along various axes and thus can provide the sensors 104-108 multiple degrees of freedom. For example, in some cases, the sensor carrier structure 220 (including the base 312) can rotate along a horizontal or yaw axis (e.g., X axis) and a vertical or pitch axis (e.g., Y axis) and thereby provide the sensors 104-108 rotational movement along the horizontal or yaw axis as well as the vertical or pitch axis. In some cases, the sensor carrier structure 220 can also extend up or down or otherwise move the sensors 104-108 up or down to adjust the altitude or height of the sensors 104-108.

In some implementations, the base 202 can include hollow space to run air and/or liquid hoses through the base 202 and to liquid and/or air cleaning systems (e.g., 218A, 218B) that can output the air and/or liquid towards the sensors 104-108 in order to clean the sensors 104-108 on the sensor carrier structure 220. In some cases, the air and/or liquid cleaning systems can reside on a stationary portion of the sensor positioning platform 200, such as a portion of the base 202. The air and/or liquid cleaning systems can output air and/or liquid towards the sensors 104-108 and/or as the sensors 104-108 rotate within a distance or reach of the air and/or liquid cleaning systems. In other cases, the air and/or liquid cleaning systems can reside on a rotating portion of the sensor positioning platform 200, such as a portion of the base 312 of the sensor carrier structure 220. The air and/or liquid cleaning systems can thus rotate with the sensors 104-108 and can output air and/or liquid towards the sensors 104-108 at any time.

In some aspects, the actuator system 204 can include one or more connectors 310A for providing connectivity to one or more components in the actuator system 204, such as the motor 212 (e.g., the rotor 302, rotor shaft 303, stator 304, position sensor 208, etc.), etc.

Figure 4:
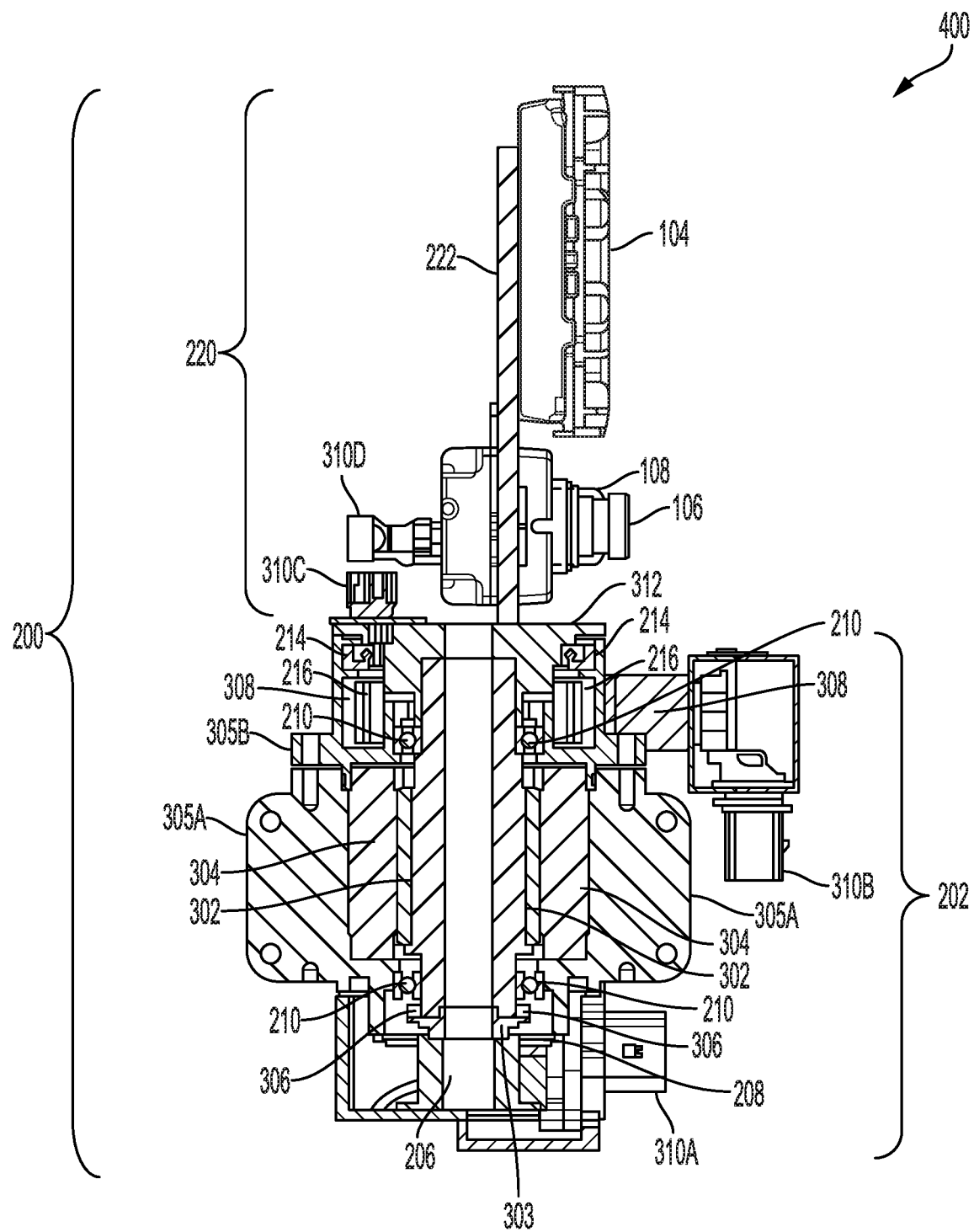
FIG. 4 illustrates another example configuration of a sensor positioning platform, in accordance with some examples.

FIG. 4 illustrates another example configuration 400 of a sensor positioning platform 200. In this example, the sensor positioning platform 200 can optionally include an actuator brake 206. The actuator brake 206 can lock the rotor 302 in position when not in use or when the rotor 302 is otherwise needed to be locked (e.g., as fail safe). In some examples, the actuator brake 206 can be used as a holding device for the rotor 302 and can be activated during certain conditions such as, for example, when the rotor 302 is not in use, during a stop or emergency condition, when the rotor 302 needs to be locked or stopped, etc. The actuator brake 206 can provide a certain amount of holding torque to handle the output torque generated by the actuator system 204.

The sensor positioning platform 200 can also include the base 202. The base 202 can include a lower stator housing 305A and an upper stator housing 305B which house the stator 304 on the base 202. In some cases, the stator housings 305A and/or 305B can include one or more brackets, which can be used to mount, secure, attach, or couple the stator housings 305A, 205B, and/or the base 202 to something. For example, the lower stator housing 305A can include one or more brackets that can be used to mount the base 202 to the autonomous vehicle 102.

The connectors 310B and 310C for providing power and data communications to the sensors 104-108 can be interconnected via electrical connectors implemented by the cable assemblies 216. In some implementations, the electrical connectors in the cable assemblies 216 can be a flexible printed circuit (FPC) capable of carrying data and/or power signals. The FPC can be a spiral FPC that can coil or curl around an axis of a rotary cable assembly 216. In other implementations, the electrical connectors can be any other type of cables, wires, electrical buses, ribbons, circuits and/or channels capable of carrying data and/or power signals.

FIG. 5A illustrates an example assembled configuration 500 of an example sensor positioning platform 200. In this example, the sensor positioning platform 200 includes a base cover 502 over a portion of the base 202. The base cover 502 is situated below the lower stator housing 305A of the actuator system 204 associated with the base 202, and can at least partially insulate or protect the covered portion of the base 202, such as a portion of connector 310A.

Moreover, in this example, a housing structure 308 containing the rotary cable assembly 216 is integrated with, or part of, the base 312 of the sensor carrier structure 220. In some examples, the housing structure 308 can rotate and move along with the base 312. In other examples, the housing structure 308 can remain static or fixed while the base 312 can rotate or move relative to the housing structure 308. For example, the housing structure 308 can remain static along with, or as part of, the base 202. The base 312 can be fit or placed within an opening on, or portion of, the housing structure 308 in a way that allows the base 312 to rotate relative to the housing structure 308.

FIG. 5B illustrates another example assembled configuration 520 of an example sensor positioning platform 200. In this example, the sensor positioning platform 200 includes a top cover 522 over the sensor carrier structure 220. The top cover 522 is situated on top of the base 312 of the sensor carrier structure 220 and covers or insulates the sensors 104-108 on the sensor carrier structure 220.

The top cover 522 includes openings 524 around portions of the top cover 522 that would otherwise cover a surface of each of the sensors 104-108. The openings 524 can expose a portion or surface of the sensors 104-108 to the outside environment. Thus, the openings 524 can allow the sensors 104-108 to send and receive signals and data without or with limited obstructions from the top cover 522, while also protecting the sensor carrier structure 220 and the sensors 104-108 from external elements.

Moreover, in this example, a housing structure 308 containing the rotary cable assembly 216 is positioned below the base 312 of the sensor carrier structure 220. The housing structure 308 can be fixed or coupled to the base 202 and can remain static while the base 312 can rotate or move relative to the housing structure 308.

Figure 6A:
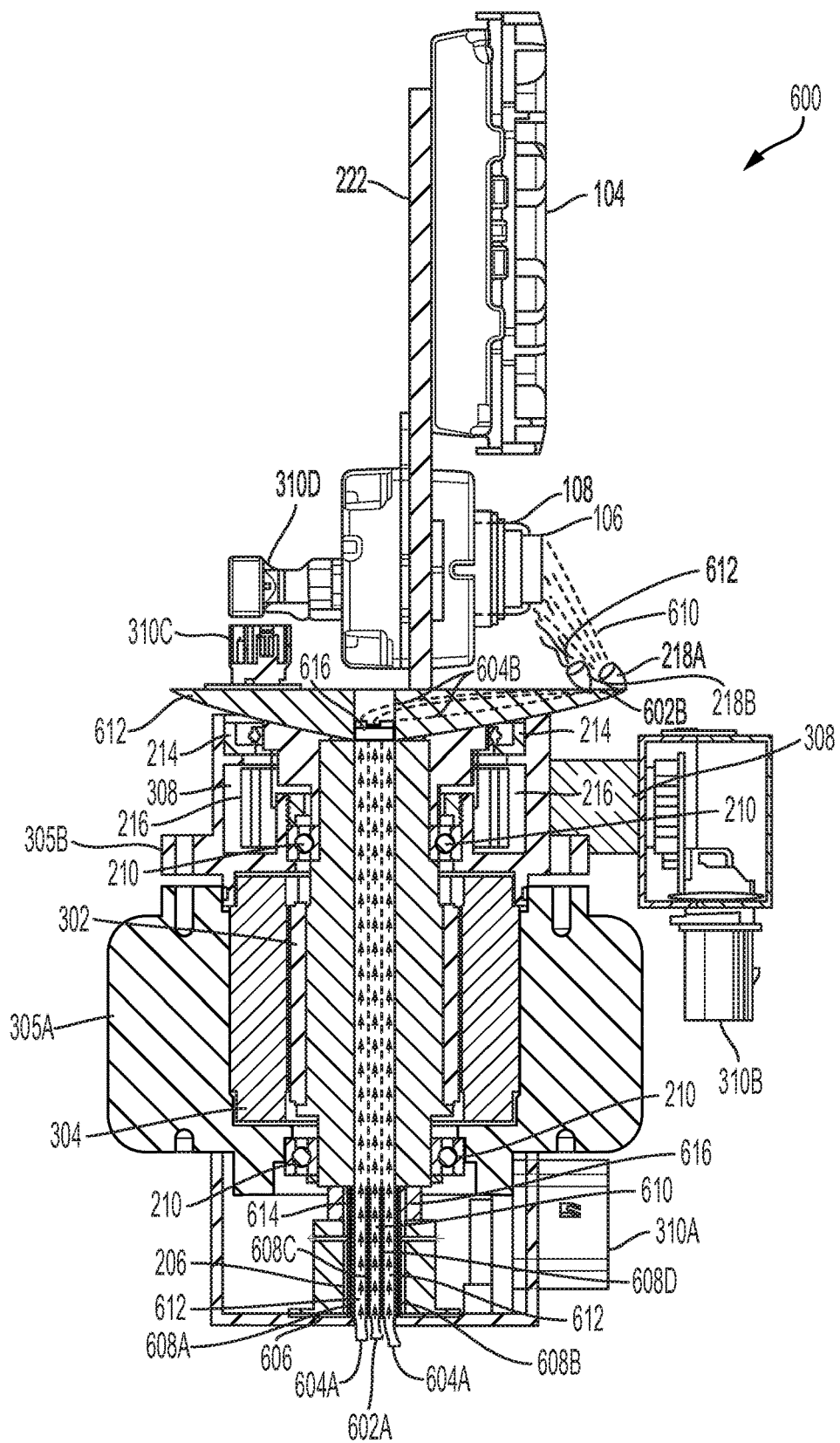
FIG. 6A illustrates an example implementation of a sensor positioning platform configured with a liquid cleaning system and an air cleaning system, in accordance with some examples.

FIG. 6A illustrates an example implementation 600 of a sensor positioning platform 200 configured with a liquid cleaning system 218A and an air cleaning system 218B. The liquid cleaning system 218A and the air cleaning system 218B can be used to clean the image sensors 106 and 108 on the sensor carrier structure 220. For example, the liquid cleaning system 218A can spray liquid on the lenses of the image sensors 106 and 108 to clean or rinse the image sensors 106 and 108, and the air cleaning system 218B can spray air on the lenses of the image sensors 106 and 108 to remove dust or other particles from the lenses of the image sensors 106 and 108 and/or to dry liquid on the lenses of the image sensors 106 and 108.

To carry liquid and air to the liquid cleaning system 218A and the air cleaning system 218B, a liquid hose 602A and one or more air hoses 604A can be mounted to a lower cover 606 of the base 202, and implemented or included within tubes 608A-D (collectively "608" hereinafter) that are also mounted to the lower cover 606 of the base 202 and that travel through at least a portion of the base 202 and/or the actuator system 204. In some examples, the tubes 608 can travel through at least a portion of a hollow bore or thru-bore in a rotor shaft 303.

In some cases, the tubes 608 can be configured to have sufficient clearance in the rotor shaft 303 to run freely even if thermal expansion occurs. In some implementations, the tubes 608 can be configured to have or leave a small gap 614 between the tubes 608 and the rotor shaft 303 to permit some leakage. Moreover, in some examples, the tubes 608 can be arranged in a concentric fashion or coaxial to each other. For example, a set of inner tubes 608C-D can be arranged within a set of outer tubes 608A-B.

The liquid hose 602A can be configured and aligned to project liquid 610 through and/or inside the set of inner tubes 608C-D, and the one or more air hoses 604A can be configured and aligned to project compressed air 612 through and/or inside the set of outer tubes 608A-B. The liquid 610 from the liquid hose 602A can travel through the hollow bore or thru-bore in the rotor shaft 303 and/or within the set of inner tubes 608C-D, and the air 612 from the one or more air hoses 604A can similarly travel through the hollow bore or thru-bore in the rotor shaft 303 and/or within the set of outer tubes 608A-B.

A fitting element 616 can be disposed on, or coupled to, a distal end of the rotor shaft 303 or tubes 608 and connect to a liquid hose 602B and one or more air hoses 604B that can respectively receive and carry the liquid 610 and air 612 to the liquid cleaning system 218A and the air cleaning system 218B. In some examples, the fitting element 616 can be a tee fitting that can connect to the liquid hose 602B and the one or more air hoses 604B and can divide the flow of liquid 610 and air 612 to the liquid hose 602B and the one or more air hoses 604B. In other examples, the fitting element 616 can be any other type of component capable of dividing the flow of liquid 610 and air 612 through the liquid hose 602B and the one or more air hoses 604B.

The liquid cleaning system 218A can receive the liquid 610 from the liquid hose 602B and output or spray the liquid 610 on and/or toward the lenses of the image sensors 104 and 106 in order to clean the image sensors 104 and 106. Similarly, the air cleaning system 218B can receive the air 612 from the one or more air hoses 604B and output or spray the air 612 on and/or toward the lenses of the image sensors 104 and 106 in order to clean the image sensors 104 and 106. The liquid cleaning system 218A and the air cleaning system 218B can each include one or more discharge elements such as one or more nozzles, vents, and/or spraying devices for controlling and enabling the flow, discharge, and/or projection of the liquid 610 and air 612 to the image sensors 104 and 106.

In some implementations, the liquid cleaning system 218A and the air cleaning system 218B can be positioned on, or secured to, a portion of the base 312 of the sensor carrier structure 220. Here, the liquid cleaning system 218A and the air cleaning system 218B can rotate along with the base 312 and thus remain in a certain position (e.g., location, proximity, angle, etc.) relative to the image sensors 104 and 106 even when the image sensors 104 and 106 are rotated. The relative position of the liquid cleaning system 218A and the air cleaning system 218B can allow the liquid cleaning system 218A and the air cleaning system 218B to be within and/or remain within an output/spraying reach or distance of the image sensors 104 and 106. Thus, the liquid cleaning system 218A and the air cleaning system 218B can output or spray liquid and air to clean the image sensors 104 and 106 at any time, even when the image sensors 104 and 106 are rotated or as the image sensors 104 and 106 rotate.

In other implementations, the liquid cleaning system 218A and the air cleaning system 218B can be positioned on a static portion (relative to the base 312 and sensors 104-108) of the base 202. Since the liquid cleaning system 218A and the air cleaning system 218B are positioned on a static portion of the base 202, the positions, angles, and/or proximities of the liquid cleaning system 218A and the air cleaning system 218B relative to the image sensors 104 and 106 can change as the image sensors 104 and 106 rotate. However, the liquid cleaning system 218A and the air cleaning system 218B can be positioned such that they are within an output/spraying reach of the image sensors 104 and 106 when the image sensors 104 and 106 are at one or more positions (e.g., proximities, locations, angles, etc.) within their range of movement/rotation. Thus, when the image sensors 104 and 106 rotate or move within a range of the liquid cleaning system 218A and the air cleaning system 218B, the liquid cleaning system 218A and the air cleaning system 218B can output or spray the liquid 610 and air 612 to clean the image sensors 104 and 106.

In some cases where the liquid cleaning system 218A and the air cleaning system 218B are positioned on a static portion (relative to the base 312 and sensors 104-108) of the base 202, the image sensors 104 and 106 can be rotated or moved (e.g., via rotation of the base 312) within the range of the liquid cleaning system 218A and the air cleaning system 218B at specific times when cleaning of the image sensors 104 and 106 is triggered or desired. In some examples, when cleaning the image sensors 104 and 106, the image sensors 104 and 106 can be rotated multiple times within the range of the liquid cleaning system 218A and the air cleaning system 218B to allow the liquid cleaning system 218A and the air cleaning system 218B to spray and clean the image sensors 104 and 106 multiple times and/or for a certain period of time within a cleaning cycle.

In some cases, the image sensors 104 and 106 can also be rotated multiple times as they are sprayed with air and/or after being sprayed with air, to help clean the image sensors 104 and 106 and/or remove or dry any liquid from the image sensors 104 and 106. For example, the image sensors 104 and 106 can shake back and forth when being cleaned and/or dried. Such rotation and movement of the image sensors 104 and 106 can be effectuated by the motor 212 (e.g., position sensor 208, rotor 302, rotor shaft 303, stator 304, lower stator housing 305A, upper stator housing 305B, etc.), which can apply force to the base 312 to rotate or move the sensor carrier structure 220, as previously explained.

While the implementation 600 shown in FIG. 6A includes both a liquid cleaning system 218A and an air cleaning system 218B, it should be noted that other implementations may include additional liquid cleaning systems and/or air cleaning systems, or may only include either a liquid cleaning system 218A or an air cleaning system 218B. The liquid cleaning system 218A and the air cleaning system 218B in FIG. 6A are provided as an illustrative example for explanation purposes.

Figure 6B:
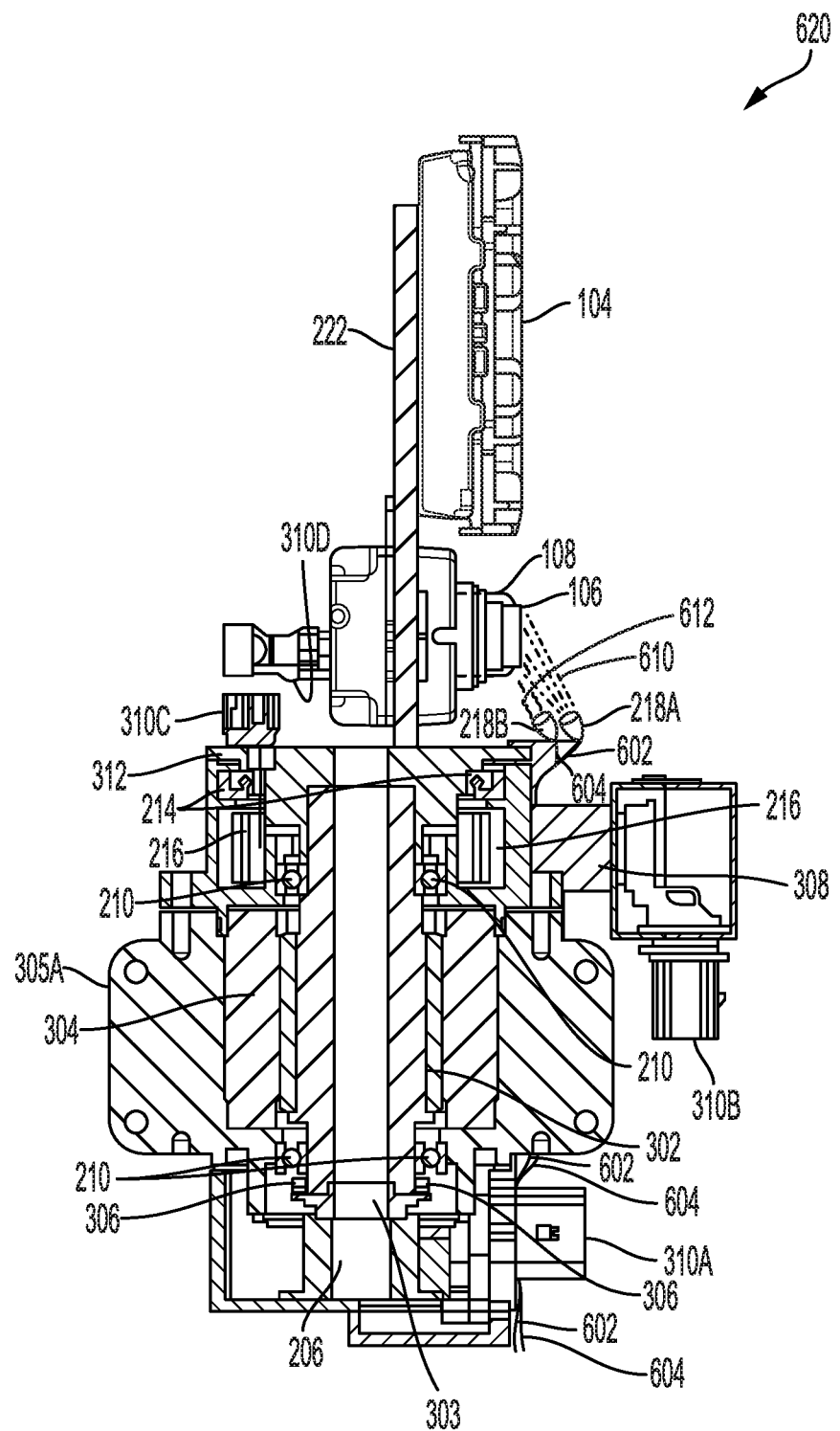
FIG. 6B illustrates another example implementation of a sensor positioning platform configured with a liquid cleaning system and an air cleaning system, in accordance with some examples.

FIG. 6B illustrates another example implementation 620 of a sensor positioning platform 200 configured with a liquid cleaning system 218A and an air cleaning system 218B. In this example, a liquid hose 602 and an air hose 604 are implemented on an outside of the sensor positioning platform 200. The liquid hose 602 and the air hose 604 can run along an outer or external portion of the base 202 and up to the liquid cleaning system 218A and the air cleaning system 218B. The liquid hose 602 and the air hose 604 can then connect to the liquid cleaning system 218A and the air cleaning system 218B, respectively.

The liquid hose 602 can carry liquid 610 to the liquid cleaning system 218A and the air hose 604 can carry air 612 to the air cleaning system 218B. The liquid cleaning system 218A and the air cleaning system 218B can then output or spray the liquid 610 and air 612 to clean the image sensors 104 and 106.

In some examples, the liquid hose 602 and/or the air hose 604 can be fastened or secured to the base 202. In other examples, the liquid hose 602 and/or the air hose 604 can may run free or loose along the outer or external portion of the base 202 without being fastened or secured to the base 202.

In some implementations, the liquid cleaning system 218A and the air cleaning system 218B can be positioned on a portion of the base 312 of the sensor carrier structure 220. Here, the liquid cleaning system 218A and the air cleaning system 218B can rotate with the base 312 and remain in a certain position (e.g., location, proximity, angle, etc.) relative to the image sensors 104 and 106. The relative position of the liquid cleaning system 218A and the air cleaning system 218B can allow the liquid cleaning system 218A and the air cleaning system 218B to be within an output/spraying reach or distance of the image sensors 104 and 106. Thus, the liquid cleaning system 218A and the air cleaning system 218B can output or spray liquid and air to clean the image sensors 104 and 106 at any time, even when the image sensors 104 and 106 are rotated or as the image sensors 104 and 106 rotate.

In other implementations, the liquid cleaning system 218A and the air cleaning system 218B can be positioned on a static portion of the base 202. Since the liquid cleaning system 218A and the air cleaning system 218B are positioned on a static portion of the base 202, the positions, angles, and/or proximities of the liquid cleaning system 218A and the air cleaning system 218B relative to the image sensors 104 and 106 can change as the image sensors 104 and 106 rotate. However, the liquid cleaning system 218A and the air cleaning system 218B can be positioned such that they are within an output/spraying reach of the image sensors 104 and 106 when the image sensors 104 and 106 are at one or more positions (e.g., proximities, locations, angles, etc.) within their range of movement/rotation. Thus, when the image sensors 104 and 106 rotate or move within a range of the liquid cleaning system 218A and the air cleaning system 218B, the liquid cleaning system 218A and the air cleaning system 218B can output or spray the liquid 610 and air 612 to clean the image sensors 104 and 106.

In some cases, the image sensors 104 and 106 can be rotated or moved (e.g., via rotation of the base 312) within the range of the liquid cleaning system 218A and the air cleaning system 218B at specific times when cleaning of the image sensors 104 and 106 is triggered or desired. In some examples, when cleaning the image sensors 104 and 106, the image sensors 104 and 106 can be rotated multiple times within the range of the liquid cleaning system 218A and the air cleaning system 218B to allow the liquid cleaning system 218A and the air cleaning system 218B to spray and clean the image sensors 104 and 106 multiple times and/or for a certain period of time within a cleaning cycle.

In some cases, the image sensors 104 and 106 can also be rotated multiple times as they are being sprayed with air and/or after being sprayed with air, to help remove or dry any remaining liquid from the image sensors 104 and 106. For example, the image sensors 104 and 106 can shake back and forth when being cleaned and/or dried.

While the implementation 620 shown in FIG. 6B includes both a liquid cleaning system 218A and an air cleaning system 218B, it should be noted that other implementations may include additional liquid cleaning systems and/or air cleaning systems, or may only include either a liquid cleaning system or an air cleaning system. The liquid cleaning system 218A and the air cleaning system 218B in FIG. 6B are provided as an illustrative example for explanation purposes.

Figure 7A:
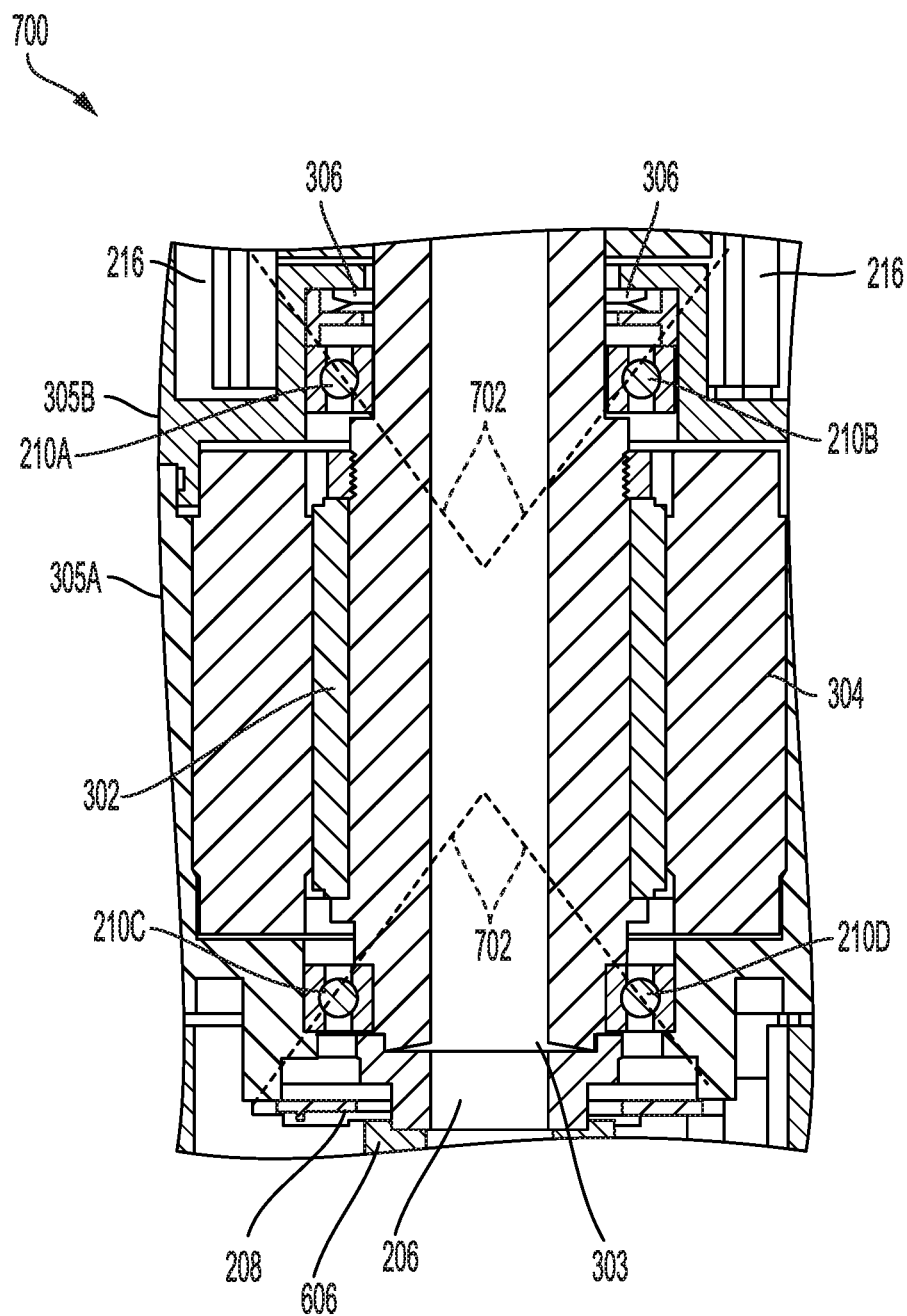
FIG. 7A illustrates an example bearing architecture for an actuator system, in accordance with some examples.

FIG. 7A illustrates an example bearing architecture 700 for an actuator system 204. The bearing architecture 700 of the actuator system 204 can affect a performance of the actuator system 204, and can affect or depend on various aspects of the actuator system 204 and the bearings 210A-D (collectively "210" hereinafter) such as, for example and without limitation, a bearing contact angle, a bearing placement, a preload, encoder pieces tolerance stack, etc.

In the example bearing architecture 700, the bearings 210 are preloaded in a face-to-face configuration 702. The springs 306 can act on an outer race of the upper bearings 210A-B. Moreover, the bearings 210 can be pressed fit onto the rotor 302.

In the unloaded case, the weight of the rotor 302 can rest on the lower bearings 210C-D in the same contact as the loaded case, and the upper bearings 210A-B can be free. In the loaded case, a spring (306) compression force and a weight of the rotor 302 can act downwards on the inner race of the lower bearings 210C-D. The compression force of the spring 306 can act downwards on the outer race of the upper bearings 210A-B.

In a shock event upwards on the stator 304, the rotor 302 may move with the stator 304 due to a rigid connection through the lower bearings 210C-D, while maintaining or without closing the encoder (208) gap. In a shock event downwards on the stator 304, the rotor 302 can be free to move up in relation to the stator 304, widening the gap between encoder pieces 208. However, in some cases, such movement may fight against the spring compression, which can increase as the rotor 302 moves up in relation to the stator 304. The rotor 302 can move upward relative to the stator 304 as the spring 306 compresses. Such amount of movement can be limited by the spacer design, and can account for the tolerance stack up between parts.

In some examples, a stack-up for tolerance between the encoder pieces 208 can go from encoder ring thickness, encoder adapter, lower bearing inner race, lower bearing ball, lower bearing outer race, and lower stator housing.

Figure 7B:
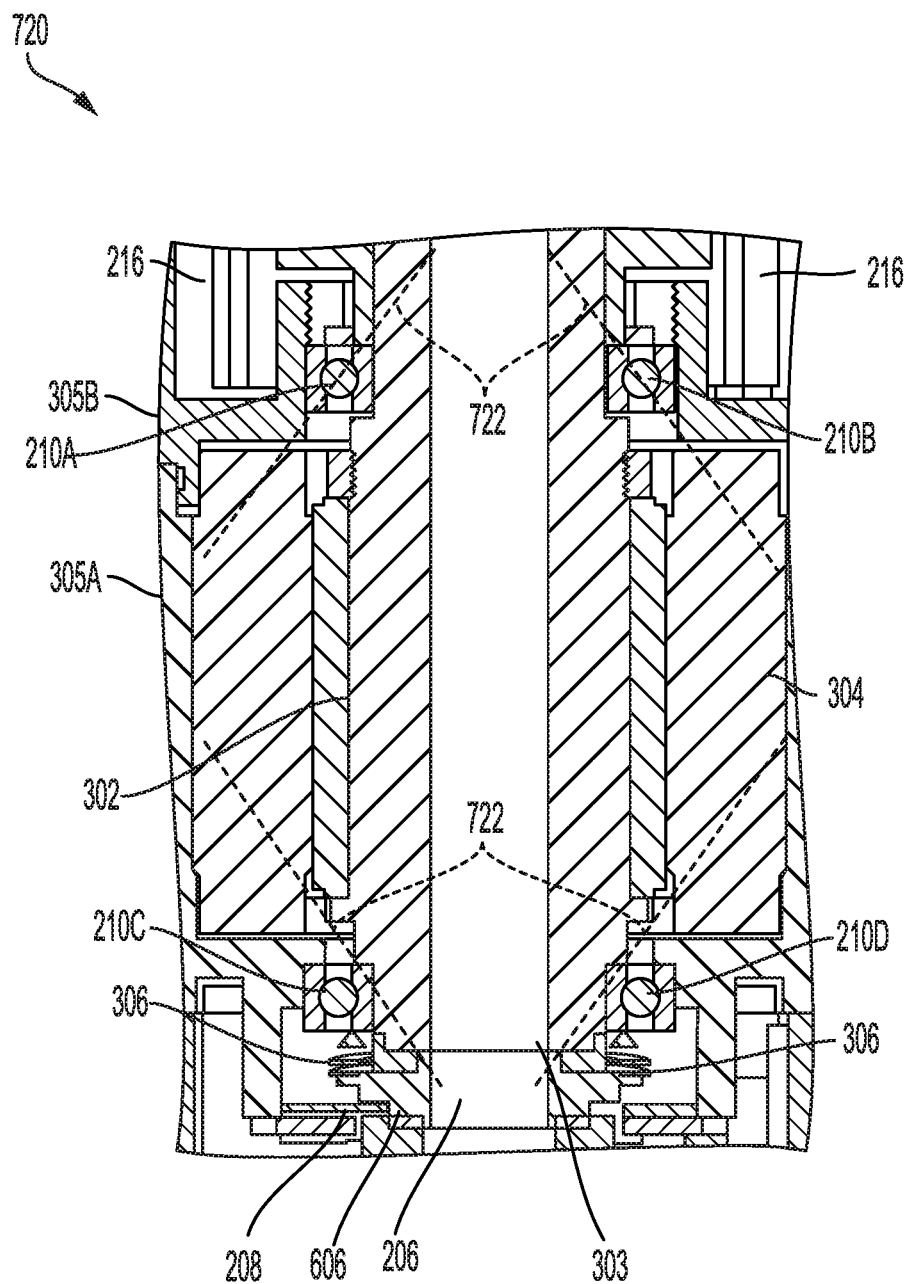
FIG. 7B illustrates another example bearing architecture for an actuator system, in accordance with some examples.

FIG. 7B illustrates another example bearing architecture 720 for an actuator system 204. In this example, the bearings 210A-D are preloaded in a back-to-back configuration 722. Moreover, the springs 306 can act on the inner race of the lower bearings 210C-D.

In the unloaded case, the weight of the rotor 302 can rest on the upper bearings 210A-C in a same contact as the loaded case, and the lower bearings 210C-D can be free. In the loaded case, the springs 306 can provide a force equal to, or nearly equal to, the compression force upwards on the inner race of the lower bearings 210C-D, changing its contact from the unloaded case. The compression force and weight of the rotor 302 can add to keep the upper bearings 210C-D in correct contact.

In a shock event upwards on the stator 304, the rotor assembly may move with the stator 304 due to the rigid connection through the upper bearings 210A-B. In a shock event downwards on the stator 304, the rotor 302 can be free to move up in relation to the stator 304, widening a gap between encoder pieces 208. However, this movement may fight against the spring compression, which may increase as the rotor 302 moves up. The rotor 302 can move as far as the axial play in the upper bearings 210A-B.

The stack-up for tolerance between the encoder pieces 208 can go from encoder ring thickness, encoder adapter, rotor, upper bearing inner race, upper bearing ball, upper bearing outer race, upper stator housing, stator winding stack, and lower stator housing.

Figure 8A:
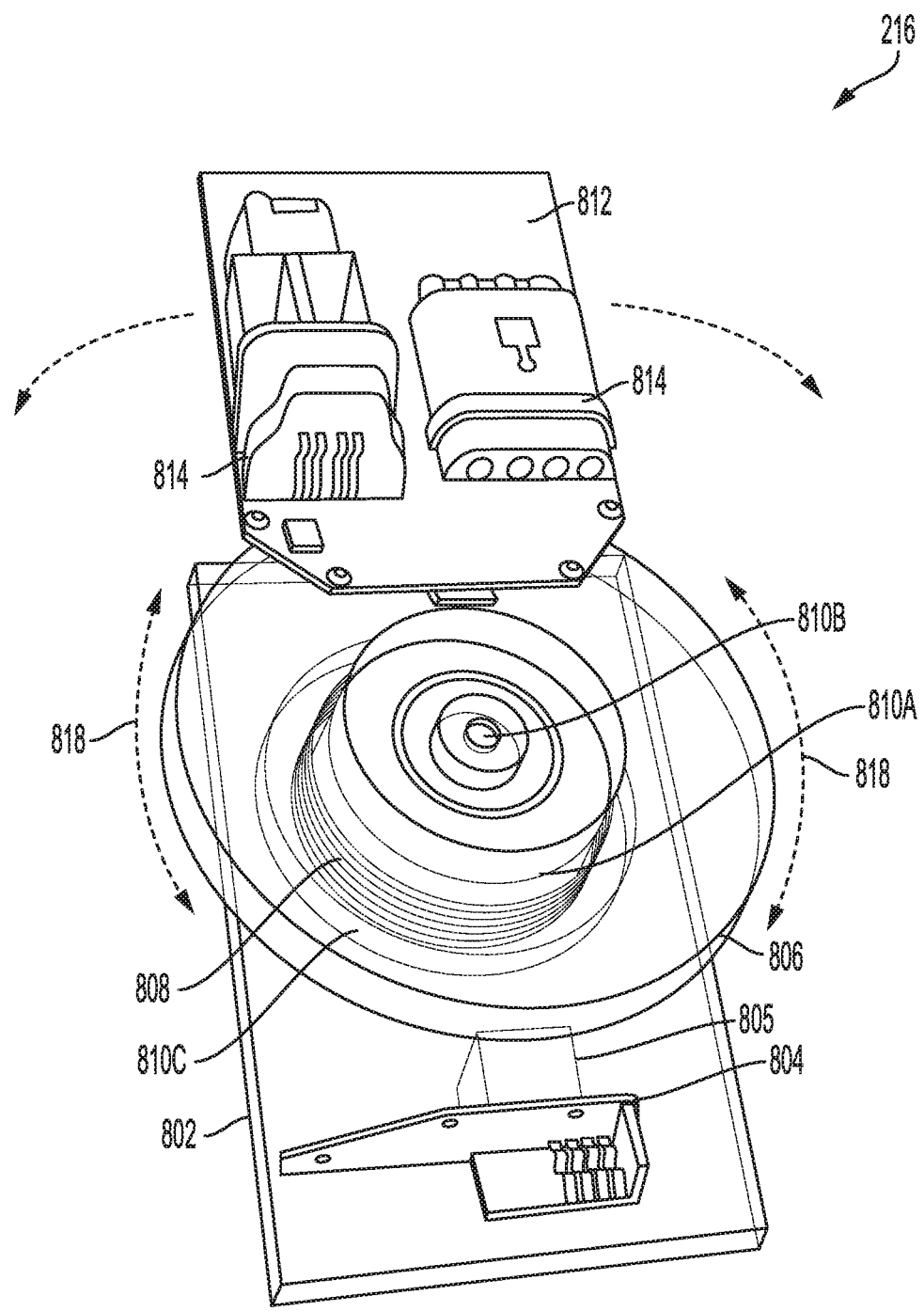
FIG. 8A illustrates an example rotary cable assembly that can be used to provide power and data connectivity to sensors on a sensor carrier structure of a sensor positioning platform, in accordance with some examples.

FIG. 8A illustrates an example rotary cable assembly 216 that can be used to provide power and/or data connectivity to the sensors 104-108 on the sensor carrier structure 220. The rotary cable assembly 216 can include a spiral and/or flex rotary electrical connector 808, and can allow the sensors 104-108 to rotate while maintaining an electrical connection with the electrical connector 808 as well as any other electrical components on the base 202 and/or the autonomous vehicle 102, which can have an electrical connection (directly or indirectly) with the electrical connector 808.

In some cases, the electrical connector 808 can include a spiral FPC. In other cases, the electrical connector 808 can include any other type of spiral and/or flex cable, ribbon, circuit, channel, line, circuit, etc. The electrical connector 808 can be housed within a first portion 802 and a second portion 806 of the rotary cable assembly 216. The second portion 806 of the rotary cable assembly 216 can sit on, or mount to, the first portion 802 of the rotary cable assembly 216 to form a cavity 820 therein, which can house the electrical connector 808. In some examples, the second portion 806 of the rotary cable assembly 216 can be rotatably coupled to the first portion 802 of the rotary cable assembly 216 through a shaft 810B extending from a spool 810A on the second portion 802 of the rotary cable assembly 216.

In some cases, the first portion 802 of the rotary cable assembly 216 can include a sidewall 810C, and the spool 810A and shaft 810B can be located inside or within the sidewall 810C. The second portion 806 of the rotary cable assembly 216 can rotate 818 relative to the first portion 802 of the rotary cable assembly 216. Moreover, the second portion 806 of the rotary cable assembly 216 can rotate 818 around the spool 810A, shaft 810B, and sidewall 810C and/or around an axis of the spool 810A and shaft 810B. The electrical connector 808 can run and/or spiral around the spool 810A, within the cavity 820, and inside of the second portion 806 of the rotary cable assembly 216. When the first portion 806 of the rotary cable assembly 216 spins or rotates relative to the second portion 802 of the rotary cable assembly 216, the electrical connector 808 can tighten or loosen as needed to support or allow such spinning or rotation.

On one end, the electrical connector 808 can connect to a circuit board 812 having one or more connectors 814. The one or more connectors 814 on the circuit board 812 can connect with one or more cables connected (directly or indirectly via other connectors such as connectors 310C-D) to the sensors 104-108 on the sensor carrier structure 220. On the other end, the electrical connector 808 can connect to a circuit board 804 having one or more connectors 805 that can connect (directly or indirectly) to other electrical components or cables on the base 202 of the sensor positioning platform 200, in order to interconnect the sensors 104-108 with such other electrical components or cables.

In some examples, the circuit board 812 can be secured, affixed, coupled, or mounted to the second portion 806 of the rotary cable assembly 216, and the circuit board 804 can be secured, affixed, coupled, or mounted to the first portion 802 of the rotary cable assembly 216. The circuit board 812 on the second portion 806 of the rotary cable assembly 216 can rotate with the second portion 806 of the rotary cable assembly 216, while the circuit board 804 on the first portion 802 of the rotary cable assembly 216 can remain static or nearly static relative to the rotating circuit board 812 and the second portion 806 of the rotary cable assembly 216. Moreover, the rotation 818 of the second portion 806 of the rotary cable assembly 216 and the circuit board 812, and the spiraling of the electrical connector 808 can allow the sensors 104-108 to rotate while remaining connected (directly or indirectly) to the electrical connector 808, the one or more connectors 805 and 814, and any other electrical component on the sensor positioning platform 200.

Figure 8B:
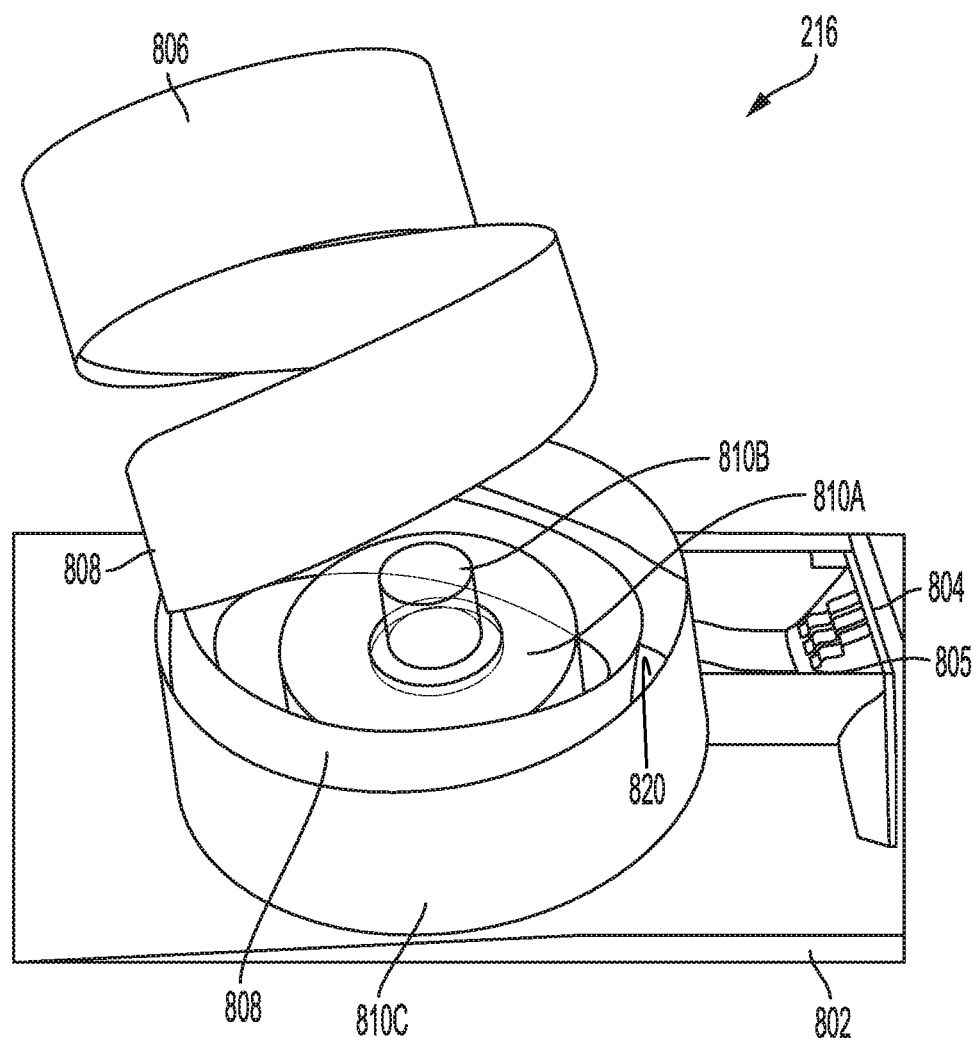
FIG. 8B illustrates an example rotary cable assembly with a portion removed to depict an example configuration of an interior of the rotary cable assembly, in accordance with some examples.

FIG. 8B illustrates the rotary cable assembly 216 with the second portion 806 of the rotary cable assembly 216 removed to depict an example configuration of an interior of the rotary cable assembly 216. As shown, the electrical connector 808 is contained inside the cavity 820 created by the sidewall 810C on the first portion of the rotary cable assembly 216 and the second portion 806 of the rotary cable assembly 216 when the second portion 806 of the rotary cable assembly 216 sits on the first portion 802 of the rotary cable assembly 216. The first portion 806 of the rotary cable assembly 216 can cover, sit over, and/or encapsulate the spool 810A on the first portion 802 of the rotary cable assembly 216. Moreover, the electrical connector 808 can wrap or spiral around the spool 810A.

The shaft 810B on the first portion 806 of the rotary cable assembly 216 can help secure or restrain the first portion 806 of the rotary cable assembly 216. When the first portion 806 of the rotary cable assembly 216 rotates, the spool 810A, shaft 810B and first portion 802 of the rotary cable assembly 216 can remain static or nearly static relative to the second portion 806 of the rotary cable assembly 216.

The first portion (802) can include, for example and without limitation, a plate, a flange, a base unit, a block, and the like. Moreover, the second portion (806) can include, for example and without limitation, a reel or spool, a cylindrical block, a plate, a flange, a coil unit, and the like.

In some examples, the spool 810A can include a reel, an elevated block or flange, a coil unit, a cylindrical block, or the like, and can fit within the first portion 806 of the cable reel assembly 806. Moreover, the spool 810A can include the shaft 810B extending therefrom, which can couple to the second portion 806 of the cable reel assembly 806 and allow the second portion 806 of the cable reel assembly 806 to rotate relative to the first portion 802 of the cable reel assembly 806. In some cases, the shaft 810B and/or the sidewall 810C can help restrain the first portion 806 of the cable reel assembly 806 while allowing the first portion 806 of the cable reel assembly 806 to rotate.

Figure 9:
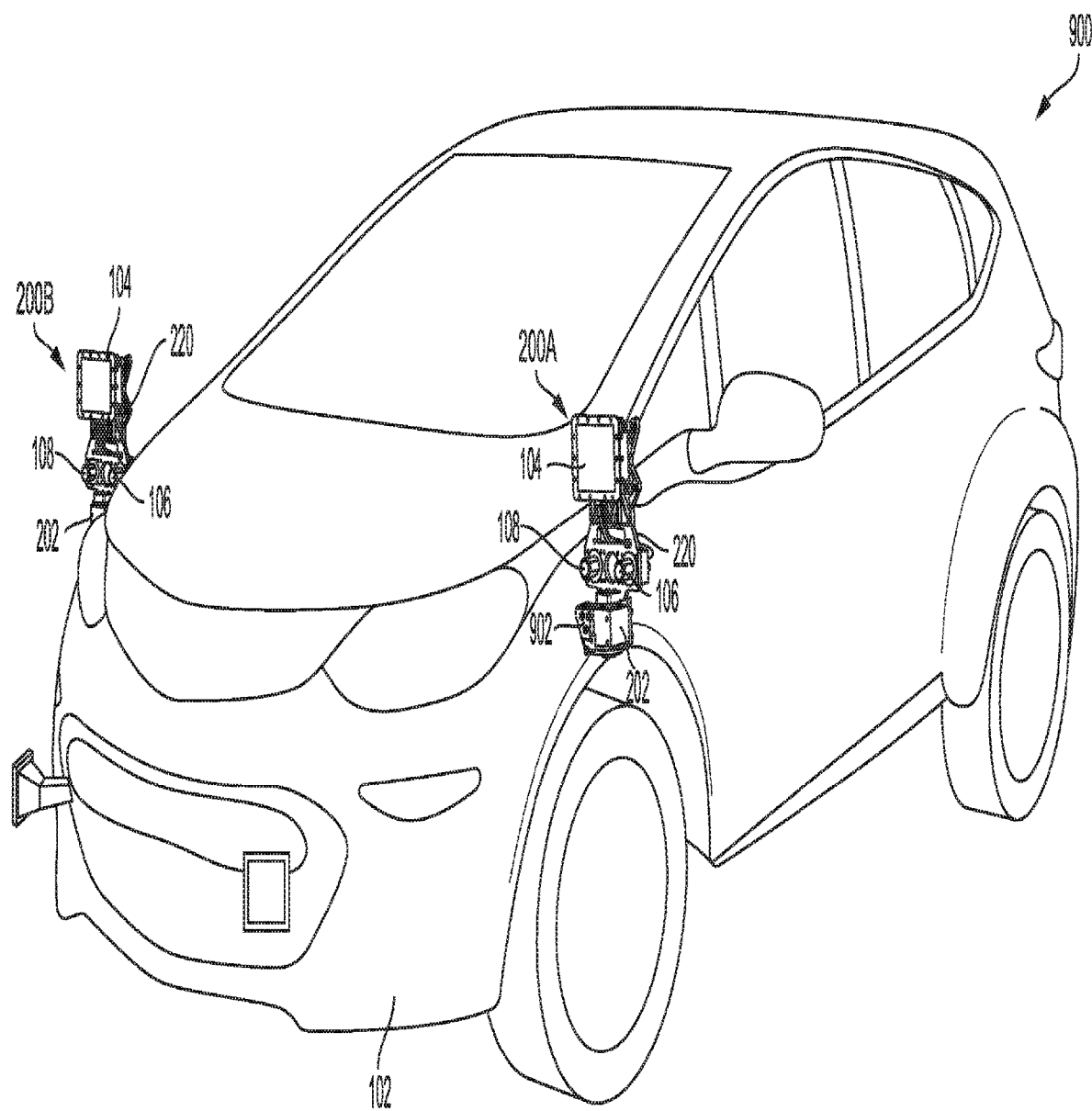
FIG. 9 illustrates an example configuration of a autonomous vehicle with sensor positioning platforms on each side of the autonomous vehicle, in accordance with some examples.

FIG. 9 illustrates an example configuration 900 of an example autonomous vehicle 102 with sensor positioning platforms 200A-B on each side of the autonomous vehicle 102. In this example, the autonomous vehicle 102 includes a first sensor positioning platform 200A on the driver's side of the autonomous vehicle 102 and a second sensor positioning platform 200B on the passenger's side of the autonomous vehicle 102. The sensor positioning platforms 200A-B can include respective sensor carrier structures 220 containing sensors 104-108, respective stationary platform assemblies 202 housing respective actuator systems (e.g., 204), and a respective securing element 902 for securing the sensor positioning platforms 200A-B to the autonomous vehicle 102.

Through the sensor positioning platforms 200A-B, the sensors 104-108 on the respective sensor carrier structures 220 can have access and visibility to the outside or external environment, allowing the sensors 104-108 to collect sensor data and measurements (e.g., images, videos, radar sensor data, laser sensor data, structured light data, etc.) of the outside or external environment associated with the autonomous vehicle 102. The sensor carrier structures 220 on the sensor positioning platforms 200A-B can be moved, positioned, rotated, oriented, etc., as previously explained, to allow the sensors 104-108 to collect sensor data and measurements from different positions, angles, locations, perspectives, field of views or coverage, etc. In some cases, the sensors 104-108 can continuously or periodically collect sensor data and measurements from a current position, an adjusted position, and/or as the sensors 104-108 are repositioned (e.g., rotated, oriented, etc.).

The ability to reposition the sensors 104-108 and obtain sensor data and measurements from different dimensions of space and time can allow the sensors 104-108 to collect sensor data and measurements from a wide variety of perspectives, and can increase the addressable field of regard of the sensors 104-108, vary the instantaneous field of view of the sensors 104-108, allow an increase and/or reduction of an allowable tracking error, etc. Moreover, the autonomous vehicle 102 can use the sensor data and measurements from the sensors 104-108 for one or more operations such as, for example, detection operations (e.g. detecting fixed and/or moving objects, animals, humans, etc.; detecting environment conditions; detecting scenes or views; etc.), tracking operations, localization operations, mapping operations, planning operations, safety operations, navigation operations, and so forth.

Figure 10:
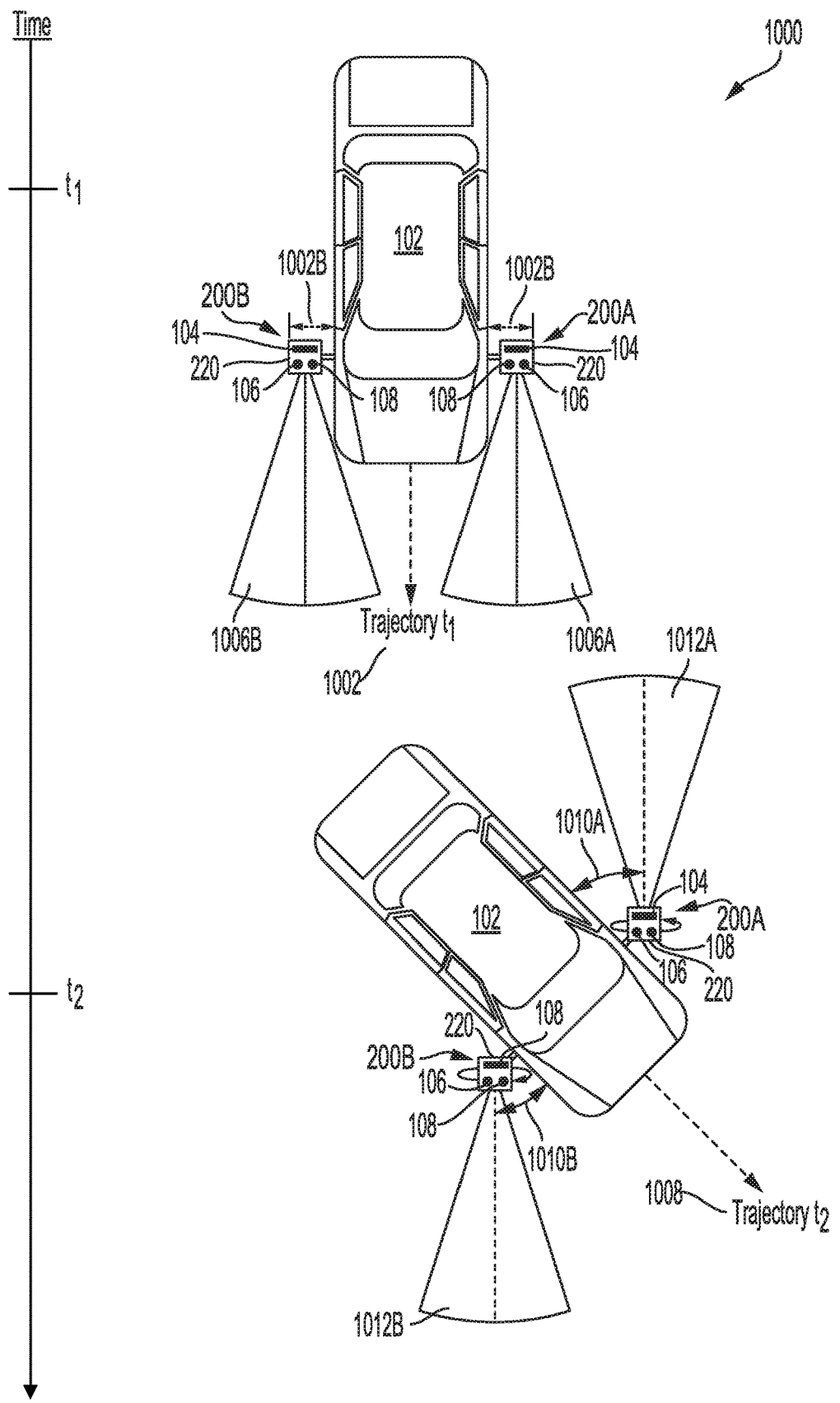
FIG. 10 illustrates an example use of sensor positioning platforms on an autonomous vehicle, in accordance with some examples.

FIG. 10 illustrates an example use 1000 of sensor positioning platforms 200A-B on an autonomous vehicle 102. In this example, the autonomous vehicle 102 is traveling in a linear trajectory 1002 at time $t_1$. The autonomous vehicle 102 includes a sensor positioning platform 200A on the driver side and a sensor positioning platform 200B on the passenger side. The sensor carrier structures 220 on the sensor positioning platforms 200A-B include sensors 104-108 which are actively, continuously, or periodically collecting sensor data and measurements from their respective positions or perspectives as the autonomous vehicle 102 travels along the trajectory 1002.

At $t_1$, the sensor carrier structure 220 on the sensor positioning platform 200A is positioned at a first rotation angle 1002A or yaw, relative to the autonomous vehicle 102 (and/or the trajectory 1002 of the autonomous vehicle 102), and the sensor carrier structure 220 on the sensor positioning platform 200B is positioned at a second rotation angle 1002B relative to the autonomous vehicle 102 (and/or the trajectory 1002 of the autonomous vehicle 102). The first rotation angle 1002A and the second rotation angle 1002B can be the same or different.

Given the first rotation angle 1002A associated with the sensor carrier structure 220 on the sensor positioning platform 200A, the sensors 104-108 on that sensor carrier structure 220 have a specific field of view 1006A at $t_1$, which is at least partly based on the first rotation angle 1002A of the sensor carrier structure 220 on which those sensors 104-108 reside. Similarly, given the second rotation angle 1002B associated with the sensor carrier structure 220 on the sensor positioning platform 200B, the sensors 104-108 on that sensor carrier structure 220 have a specific field of view 1006B at $t_1$, which is at least partly based on the second rotation angle 1002B of the sensor carrier structure 220 on which those sensors 104-108 reside.

As shown in FIG. 10, at $t_2$, the autonomous vehicle 102 is making a turn and has consequently changed its direction of travel to a different trajectory 1008. As (or before) the autonomous vehicle 102 turns and travels in the different trajectory 1008, the sensor carrier structures 220 on the sensor positioning platforms 200A-B can be repositioned to different rotational angles 1010A-B. The sensor carrier structures 220 can be repositioned by the respective actuator systems 204 (e.g., via the motors 212) on the sensor positioning platforms 200A-B, as previously explained. The sensor carrier structures 220 can be repositioned to adjust the position of the sensors 104-108 on the sensor positioning platforms 200A-B in order to achieve different fields of view 1012A-B, which can be based at least partly on the different rotational angles 1010A-B, and obtain sensor data for different areas of interest at least partly within the different fields of view 1012A-B.

In one illustrative example, the different areas of interest can include an area along the different trajectory 1008 which the autonomous vehicle 102 is crossing or plans to cross, and an area that the autonomous vehicle 102 needs to check for objects (e.g., oncoming/incoming vehicles, pedestrians, etc.) before or while the autonomous vehicle 102 travels in or towards the different trajectory 1008 (e.g., before or while the autonomous vehicle 102 crosses a lane, makes a turn, makes a maneuver, changes direction, etc.). Other non-limiting examples of areas of interest that can be targeted through the repositioning of the sensor carrier structures 220 can include an area where a certain object or condition is located that the autonomous vehicle 102 is tracking, a blind spot, an area for which the autonomous vehicle 102 wants to collect more sensor data (e.g., to gain greater insight or visibility into the area and/or the surrounding environment, to confirm that no safety hazards or approaching objects exist, etc.), an area for which the autonomous vehicle 102 wants to get new or additional sensor data, and/or any other area that may be of interest to the autonomous vehicle 102 for any reason (e.g., safety, navigation, visibility, localization, mapping, etc.).

In some cases, the repositioning of the sensor carrier structures 220 at $t_2$ (and/or the different rotational angles 1010A-B) can be calculated and/or performed in response to, or in anticipation of, the different trajectory 1008 and/or a change (actual and/or predicted) in direction or trajectory of the autonomous vehicle 102 between $t_1$ and $t_2$. For example, the different rotational angles 1010A-B can be selected and/or calculated to account for the different trajectory 1008, a change in the relative position or motion of the autonomous vehicle 102 and other objects due to the different trajectory 1008, a change in the surrounding environment and/or circumstances of the autonomous vehicle 102 due to the different trajectory 1008, a gap in visibility and/or current data due to the different trajectory 1008, a need to gain additional perspectives due to the different trajectory 1008, a need to supplement the data or estimates for one or more areas due to the different trajectory 1008, and/or any other reason or condition prompted by the autonomous vehicle 102 changing its direction of travel to the different trajectory 1008.

Figure 11:
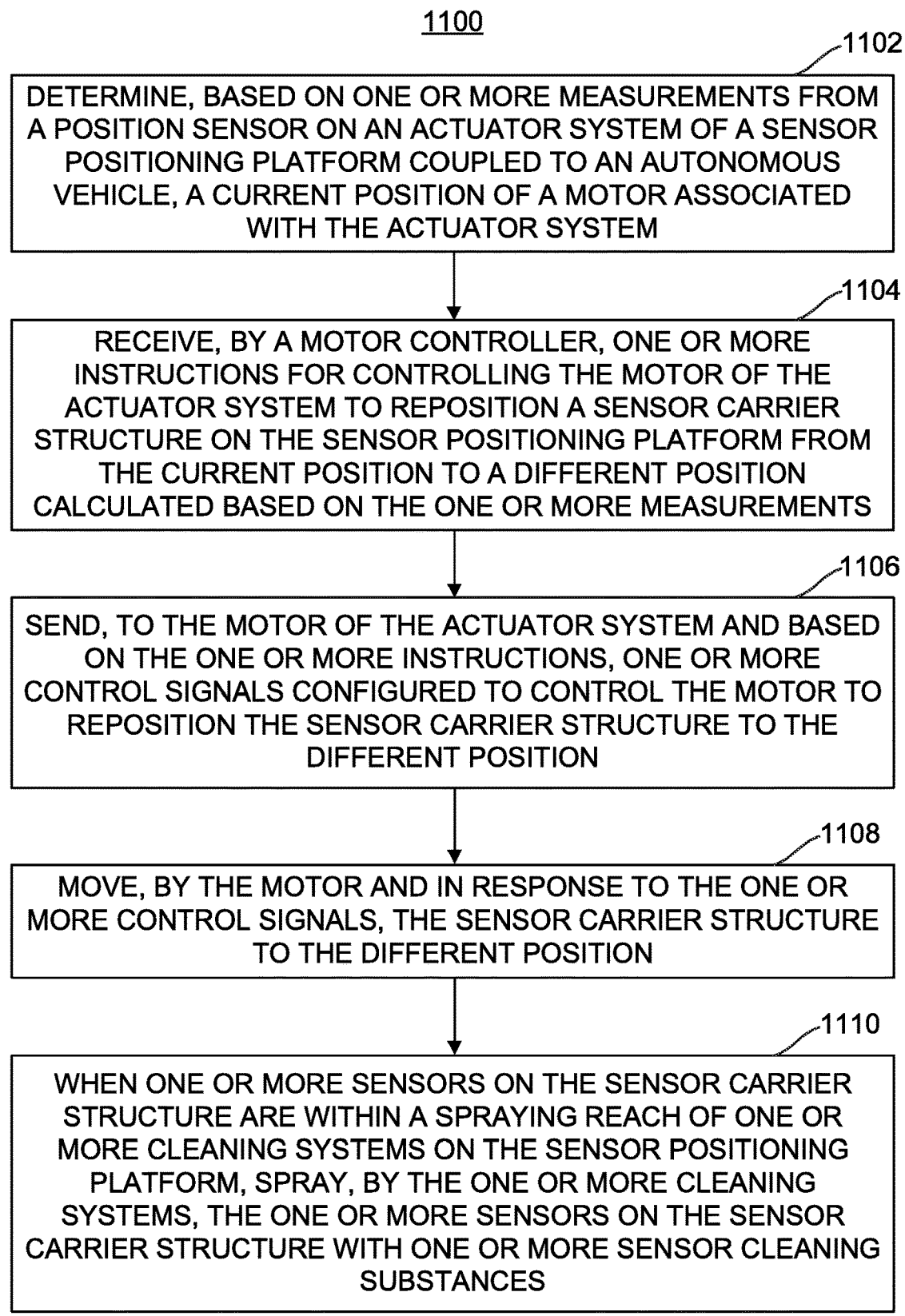
FIG. 11 illustrates an example method for implementing a sensor positioning platform on an autonomous vehicle, in accordance with some examples.
Figure 12:
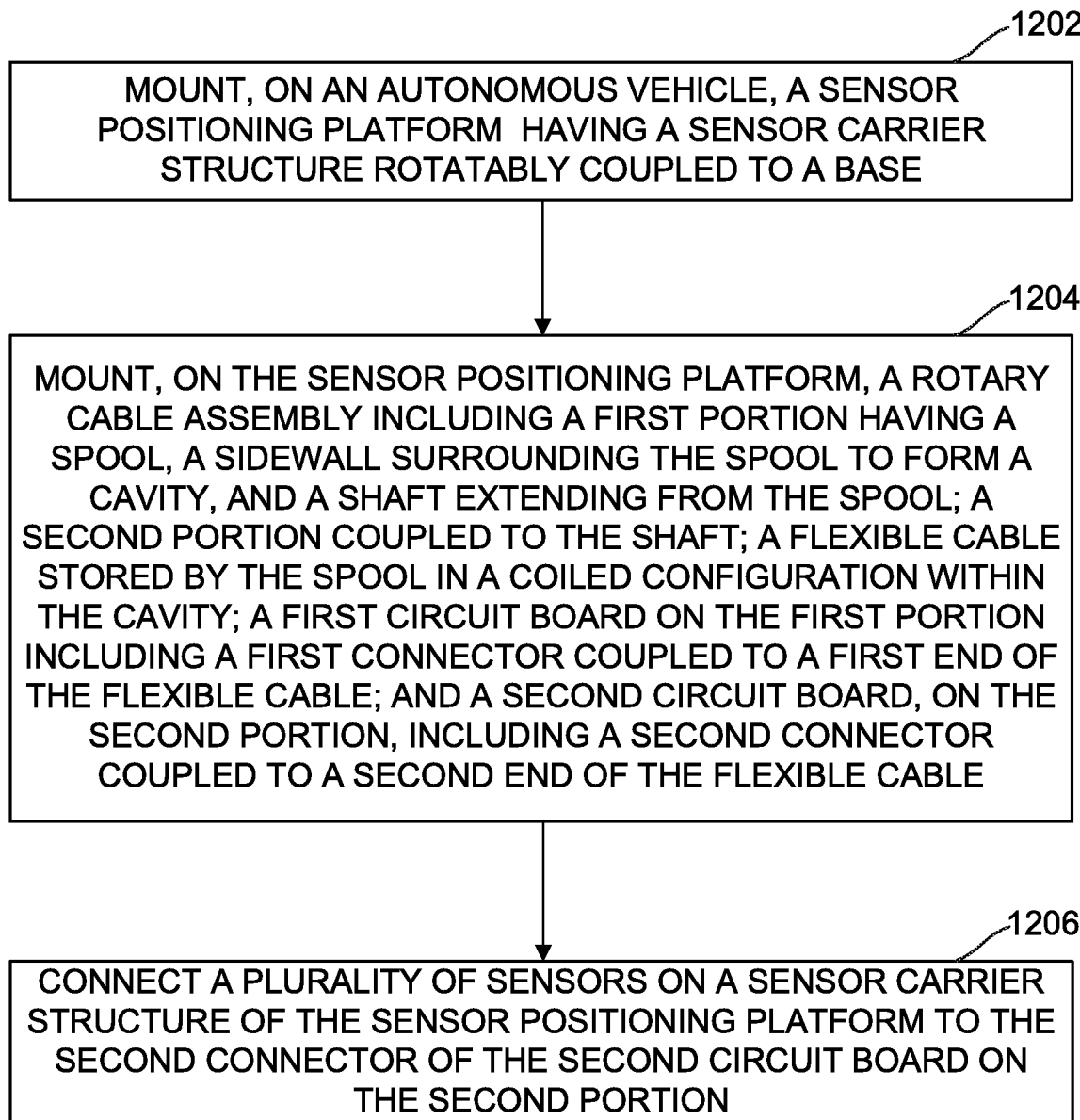
FIG. 12 illustrates an example method for implementing a rotary cable assembly on a sensor positioning platform, in accordance with some examples.

Having disclosed some example system components and concepts, the disclosure now turns to FIGS. 11 and 12, which illustrate example methods 1100 and 1200 for implementing a sensor positioning platform on an autonomous vehicle. The steps outlined herein are exemplary and can be implemented in any combination thereof, including combinations that exclude, add, or modify certain steps.

At step 1102, the method 1100 can include determining, based on one or more measurements from a position sensor (208) on an actuator system (204) of a sensor positioning platform (200) coupled to an autonomous vehicle (102), a current position of a motor (212) associated with the actuator system (204). The one or more measurements can indicate or measure a current position (e.g., angle, location, etc.) of the motor (212) sensed by the position sensor (208). The position sensor (208) can calculate the one or more measurements and report them to another device or component, such as a motor controller (240) and/or an internal computing system (110) on the autonomous vehicle (102), for example.

In some cases, the one or more measurements can be used to determine, estimate, or infer a current position of a sensor carrier structure (220) on the sensor positioning platform (200) and/or sensors (104-108) on the sensor carrier structure (220). Moreover, in some examples, the one or more measurements of the current position of the motor (212) can be used to determine whether the sensor carrier structure (220) and/or the sensors on the sensor carrier structure (220) should be repositioned, determine how to reposition the sensor carrier structure (220) and/or the sensors on the sensor carrier structure (e.g., where they should be repositioned to, how much to move or rotate them, etc.), etc.

At step 1104, the method 1100 can include receiving, by a motor controller (240), one or more instructions for controlling the motor (212) of the actuator system (204) to reposition a sensor carrier structure (220) on the sensor positioning platform (200) from the current position to a different position calculated based on the one or more measurements. The sensor carrier structure (220) can include a plurality of sensors (104-108), such as a radar, an image sensor, a thermal image sensor, etc. Moreover, in some cases, the different position can be calculated and/or a determination that the sensor carrier structure (220) should be repositioned can be made using additional information.

For example, to calculate the different position and/or determine that the sensor carrier structure (220) should be repositioned, various factors can be considered such as conditions associated with the autonomous vehicle (e.g., environment conditions or events, traffic or road conditions, navigation conditions, etc.), an operation of the autonomous vehicle (e.g., a current or future state of the autonomous vehicle, a status of the autonomous vehicle, etc.), a state and/or condition of the sensors on the sensor carrier structure (e.g., visibility, obstructions, errors, cleanliness, etc.), and/or any other events or data relevant to determining whether the sensors should be repositioned to clean them, obtain better visibility or accuracy, protect them from a hazard, adjust their FOV, etc.

In some cases, the motor controller (240) can receive the one or more instructions from a device or component associated with the motor controller (240), such as a processor that determined that the sensor carrier structure (220) should be repositioned and/or generated the one or more instructions. In other cases, the motor controller (240) can receive the one or more instructions from a separate device, such as an internal computing system (110) on the autonomous vehicle (102). For example, the internal computing system (110) can use the one or more measurements to determine that the sensor carrier structure (220) should be repositioned and/or where the sensor carrier structure (220) should be repositioned to, and provide to the motor controller (240) the one or more instructions for repositioning the sensor carrier structure (220).

In some examples, in addition to using the one or more measurements to determine that the sensor carrier structure (220) should be repositioned and/or where the sensor carrier structure (220) should be repositioned, the internal computing system (110) (or any other device) can also use other information relevant information. For example, the internal computing system (110) (or any other device) can also consider conditions associated with the autonomous vehicle (102), an operation or behavior of the autonomous vehicle (102), a state and/or condition of the sensors on the sensor carrier structure (220), and/or any other events or data relevant to determining whether the sensors should be repositioned to clean them, to obtain better visibility or accuracy, to protect them from a hazard, to adjust their FOV, etc.

At step 1106, the method 1100 can include sending, to the motor (212) of the actuator system (204) and based on the one or more instructions, one or more control signals configured to control the motor (212) to reposition the sensor carrier structure (220) to the different position. For example, in some cases, to generate the one or more control signals, the motor controller (240) can translate the one or more instructions into a format and power level that can move the motor (212) to the different position. The motor controller (240) can then send (e.g., transmit, provide, apply, etc.) the control signal(s) to the motor (212) in order to trigger the motor (212) to move to the different position.

At step 1108, the method 1100 can include moving, by the motor (212) and in response to the one or more control signals, the sensor carrier structure (220) to the different position. In some examples, the one or more control signals can include a series of voltages that can be applied to the motor (212) to make the motor (212) spin and move the sensor carrier structure (220) to the different position. The motor (212) can receive the one or more control signals from the motor controller (240) and use the one or more control signals to move the sensor carrier structure (220) containing the sensors (104-108) in order to move or reposition the sensors (104-108) to the different position.

At step 1110, when one or more sensors (104, 106, 108) on the sensor carrier structure (220) are within a spraying reach of one or more cleaning systems (218A-B) on the sensor positioning platform (200), the method 1100 can include spraying, by the one or more cleaning systems (218A-B), the one or more sensors (104, 106, 108) on the sensor carrier structure (220) with one or more sensor cleaning substances. The one or more cleaning systems (218A-B) can spray the one or more sensors (104, 106, 108) on the sensor carrier structure (220) with the one or more sensor cleaning substances in order to clean the one or more sensors. Moreover, in some cases, the one or more cleaning systems (218A-B) can spray the one or more sensors (104, 106, 108) on the sensor carrier structure (220) with the one or more sensor cleaning substances multiple times and/or in multiple cleaning cycles.

In some cases, the one or more sensor cleaning substances can include air and/or liquid (e.g., water, cleaning solution, etc.). Moreover, in some examples, the one or more sensors can include one or more image sensors. For example, in some cases, the one or more sensors can include a visible light image sensor and a thermal imaging or infrared image sensor. Further, in some examples, the one or more cleaning systems (218A-B) can include one or more spraying elements, such as, for example and without limitation, one or more nozzles, spray vents or outlets, spray heads, spray guns, pressurized sprayer, etc.

In some aspects, the method 1100 can include outputting, by one or more hoses (602A, 604A) arranged within one or more tubes (608A, 608B, 608C, 608D) mounted to a lower portion (606) of the actuator system (204), the one or more sensor cleaning substances through a thru-bore on a rotor shaft (303) of the motor (212) associated with the actuator system (204), and receiving, by the one or more cleaning systems, the one or more sensor cleaning substances via one or more additional hoses (602B, 604B) coupled to a fitting element (616) on the one or more tubes or the rotor shaft.

In some examples, a first respective end of the one or more additional hoses (602B, 604B) can be connected to the one or more cleaning systems (218A-B) and a second respective end of the one or more additional hoses (602B, 604B) can be coupled to the fitting element (616). Moreover, in some cases, the fitting element (616) can be coupled to a first end of the rotor shaft (303) or the one or more tubes (608A, 608B, 608C, 608D) that is opposite to a second end associated with (e.g., at, by, within, adjacent, etc.) the lower portion (606) of the actuator system (204).

In some examples, the thru-bore on the actuator system (204) can include a hollow bore on a rotor shaft (303) of the motor (212) associated with the actuator system (204), and the one or more hoses can be configured to project the one or more sensor cleaning substances through the hollow bore on the rotor shaft (303) of the motor (212) and/or the one or more tubes. In some cases, the one or more tubes can be implemented within at least a portion of the hollow bore on the rotor shaft (303) of the motor (204). For example, the one or more tubes can be configured to interface with an opening or inlet of the hollow bore and/or can be contained within at least a portion of the hollow bore, such as a lower portion, the entire hollow bore, or up to a certain vertical length of the hollow bore.

In some implementations, the one or more hoses can include a liquid hose for liquid and/or an air hose for air, and the one or more cleaning systems can include a liquid cleaning system (218A) and/or an air cleaning system (218B). Moreover, the one or more tubes can include a first set of tubes (608A-B) associated with the air hose and/or a second set of tubes (608C-D) associated with the liquid hose. In some cases, the one or more tubes can include the first set of tubes (608A-B) and the second set of tubes (608A-B), and the first set of tubes (608A-B) and the second set of tubes (608A-B) can be arranged coaxial or concentric to each other.

In some aspects, the actuator system (204) can include an actuator brake (206) configured to stop or lock a rotor (302) associated with the motor (212) of the actuator system (204). Moreover, in some cases, the sensor positioning platform (200) can include a base (202) that is coupled to the sensor carrier structure (220). The base (202) can include the actuator system (204), as well as one or more other components such as, for example and without limitation, a surround view camera (230), a temperature sensor, a power supply, one or more processors, one or more rotary cable assemblies (216), etc.

The one or more cleaning systems (218A-B) can be located on a portion of the sensor positioning platform (200) that remains stationary relative to the sensor carrier structure (220) when the sensor carrier structure (220) is moved or repositioned by the motor (212), or a portion of the sensor carrier structure (220) configured to move with the sensor carrier structure (220) when the sensor carrier structure (220) is moved or repositioned by the motor (212).

For example, in some implementations, the one or more cleaning systems (218A-B) can be located on a portion of the sensor carrier structure (220) that moves or rotates with the sensor carrier structure (220) anytime the sensor carrier structure (220) is moved or rotated by the motor (212). Thus, the one or more cleaning systems (218A-B) can be configured to move with the sensor carrier structure (220) when the sensor carrier structure (220) is moved or repositioned by the motor (212). In this example, the one or more cleaning systems (218A-B) can remain within a spraying reach of the one or more sensors even when or as the one or more sensors (and the sensor carrier structure) are repositioned.

As previously noted, in other implementations, the one or more cleaning systems (218A-B) can be located on a portion of the base (202) that remains stationary relative to the sensor carrier structure (220) when the sensor carrier structure (220) (and the sensors on the sensor carrier structure) is moved or repositioned by the motor (212). In this example, the one or more cleaning systems (218A-B) can be configured to spray the one or more sensor cleaning substances on the one or more sensors when the one or more sensors are within a spraying reach of the one or more cleaning systems (218A-B). For example, the one or more cleaning systems (218A-B) can be configured to spray the one or more sensors with the one or more sensor cleaning substances when the sensor carrier structure (220) is moved or rotated (e.g., as part of a cleaning procedure or as part of one or more operations) to a certain amount that places the one or more sensors within a certain proximity and/or angle relative to the one or more cleaning systems (218A-B).

In some aspects, the method 1100 can include receiving, by the motor (212) and from the motor controller (240), a control signal configured to move the sensor carrier structure (220) back and forth within a spraying range of the one or more cleaning systems (218A-B), and move the sensor carrier structure (220) back and forth within the spraying range while the one or more cleaning systems spray (218A-B) the one or more sensor cleaning substances on the one or more sensors.

Moreover, in some examples, the motor (212) can be configured to move and reposition the sensor carrier structure (220) and the sensors (104-108) on the sensor carrier structure (220) during an operation of the autonomous vehicle (102), such as during a driving or navigating operation. The sensors (104-108) can be configured to gather sensor data before the sensor carrier structure (220) is moved and repositioned, as the sensor carrier structure (220) is moved and repositioned, and/or after the sensor carrier structure (220) is moved and repositioned. This can allow the sensors (104-108) to obtain sensor data from different positions (e.g., different angles, locations, etc.) and expand or target their visibility or FOV.

FIG. 12 illustrates an example method 1200 for implementing a rotary cable assembly (216) on a sensor positioning platform (200). At step 1202, the method 1200 can include mounting a sensor positioning platform (200) to an autonomous vehicle (102). The sensor positioning platform (200) can include a sensor carrier structure (220) rotatably coupled to a base (202). The sensor carrier structure (220) can include one or more sensors (104-108) and the base (202) can include an actuator system (204) configured to rotate the sensor carrier structure (220) relative to the base (202).

At step 1204, the method 1200 can include mounting a rotary cable assembly (216) to the sensor positioning platform (200). In some examples, the rotary cable assembly (216) can include a first portion (802) having a spool (810A), a sidewall (810C) surrounding the spool (810A) to form a cavity (820) therein, and a shaft (810B) extending from the spool (810A); a second portion (806) coupled to the shaft (810B) and configured to rotate with respect to the first portion (802); a flexible electrical cable (808) stored by the spool (810A) in a coiled configuration within the cavity (820); a first circuit board (804) on the first portion (802); and a second circuit board (812) on the second portion (806).

The first portion (802) can include, for example and without limitation, a plate, a flange, a base unit, a block, and the like. Moreover, the second portion (806) can include, for example and without limitation, a reel or spool, a cylindrical block, a plate, a flange, a coil unit, and the like.

The first circuit board (804) can include a first connector (805) electrically coupled to a first end of the flexible electrical cable (808). The first connector (805) can be configured to connect to one or more electrical components (e.g., the internal computing system 110, the motor controller 240, one or more components on the actuator system 204, etc.) on the base (202) of the sensor positioning platform (200) and/or the autonomous vehicle (102).

The second circuit board (812) can include a second connector (814) electrically coupled to a second end of the flexible electrical cable (808). Moreover, the second circuit board (812) can be configured to rotate with the second portion (806) of the rotary cable assembly (216).

At step 1206, the method 1200 can include connecting the plurality of sensors (104-108) on the sensor carrier structure (220) to the second connector (814) of the second circuit board (812) on the second portion (806). The plurality of sensors (104-108) can then receive power and/or data connectivity, which can be provided and/or transmitted through the second circuit board (812) and the second connector (814), and continue to receive such power and/or data connectivity even when the sensor carrier structure (220) and the plurality of sensors (104-108) on the sensor carrier structure (220) are rotated relative to the base (202) of the sensor positioning platform (200) and the first portion (802) of the rotary cable assembly (216).

In some examples, the first portion (802) of the rotary cable assembly (216) can remain stationary relative to the sensor carrier structure (220) when the sensor carrier structure (220) is rotated by the actuator system (204). Moreover, in some implementations, the flexible electrical cable (808) can include a flexible printed circuit configured to provide power and data connectivity to the plurality of sensors (104-108) on the sensor carrier structure (220). The flexible printed circuit can be configured to tighten or loosen when the second portion (806) of the rotary cable assembly (216) and the second circuit board (812) rotate around an axis of the first portion (802) of the rotary cable assembly (216).

In some examples, the rotary cable assembly (216) can be mounted to a portion of the base (202) of the sensor positioning platform (200) that remains stationary relative to the sensor carrier structure (220) when the sensor carrier structure (220) is moved or repositioned by the actuator system (204). Moreover, the second portion (806) of the rotary cable assembly (216) and the second circuit board (812) can rotate around an axis of the first portion (802) of the rotary cable assembly (216) at least partly based on a rotation of the sensor carrier structure (220).

The plurality of sensors (104-108) on the sensor carrier structure (220) can be connected to the second connector (814) of the second circuit board (812) via one or more electrical cables connected to at least one connector (310C, 310D) on the sensor carrier structure (220).

As described herein, one aspect of the present technology includes gathering and using data available from various sources to improve quality and experience. The present disclosure contemplates that in some instances, this gathered data may include personal information. The present disclosure contemplates that the entities involved with such personal information respect and value privacy policies and practices.

Figure 13:
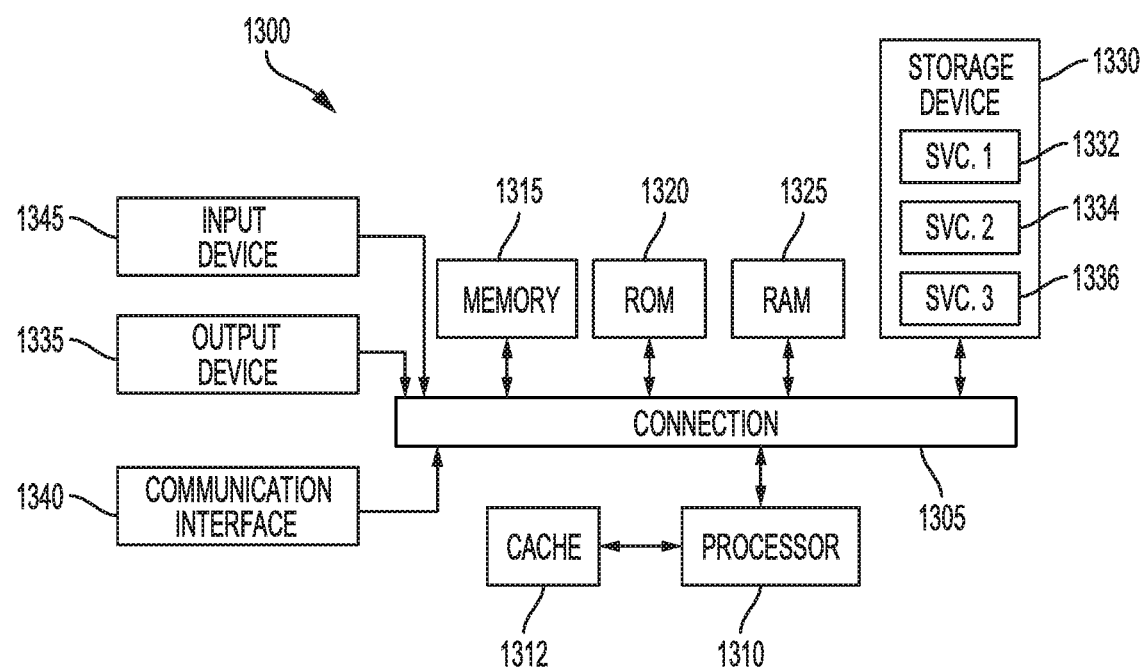
FIG. 13 illustrates an example computing system architecture for implementing various aspects of the present technology.

FIG. 13 illustrates an example computing system 1300 which can be, for example, any computing device making up internal computing system 110, remote computing system 150, a passenger device executing rideshare application 170, or any other computing device. In FIG. 13, the components of the computing system 1300 are in communication with each other using connection 1305. Connection 1305 can be a physical connection via a bus, or a direct connection into processor 1310, such as in a chipset architecture. Connection 1305 can also be a virtual connection, networked connection, or logical connection.

In some embodiments, computing system 1300 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 1300 includes at least one processing unit (CPU or processor) 1310 and connection 1305 that couples various system components including system memory 1315, such as read-only memory (ROM) 1320 and random access memory (RAM) 1325 to processor 1310. Computing system 1300 can include a cache of high-speed memory 1312 connected directly with, in close proximity to, or integrated as part of processor 1310.

Processor 1310 can include any general purpose processor and a hardware service or software service, such as services 1332, 1334, and 1336 stored in storage device 1330, configured to control processor 1310 as well as a special-purpose processor where software instructions are incorporated into the actual processor design. Processor 1310 may essentially be a completely self-contained computing system, containing multiple cores or processors, a bus, memory controller, cache, etc. A multi-core processor may be symmetric or asymmetric.

To enable user interaction, computing system 1300 includes an input device 1345, which can represent any number of input mechanisms, such as a microphone for speech, a touch-sensitive screen for gesture or graphical input, keyboard, mouse, motion input, speech, etc. Computing system 1300 can also include output device 1335, which can be one or more of a number of output mechanisms known to those of skill in the art. In some instances, multimodal systems can enable a user to provide multiple types of input/output to communicate with computing system 1300. Computing system 1300 can include communications interface 1340, which can generally govern and manage the user input and system output. There is no restriction on operating on any particular hardware arrangement, and therefore the basic features here may easily be substituted for improved hardware or firmware arrangements as they are developed.

Storage device 1330 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 1330 can include software services, servers, services, etc., that when the code that defines such software is executed by the processor 1310, it causes the system to perform a function. In some embodiments, a hardware service that performs a particular function can include the software component stored in a computer-readable medium in connection with the necessary hardware components, such as processor 1310, connection 1305, output device 1335, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" a set indicates that one member of the set or multiple members of the set satisfy the claim. For example, claim language reciting "at least one of A and B" means A, B, or A and B.

What is claimed is:

1. A system comprising:
a sensor positioning platform comprising a sensor carrier structure rotatably coupled to a base, wherein the sensor carrier structure comprises one or more sensors and the base comprises an actuator system configured to rotate the sensor carrier structure relative to the base;
a rotary cable assembly on the sensor positioning platform, the rotary cable assembly comprising a spool, a sidewall surrounding the spool to form a cavity therein, and a shaft extending from the spool, a flexible electrical cable stored by the spool in a coiled configuration within the rotary cable assembly, and a circuit board; and one or more electrical cables connecting the one or more sensors on the sensor carrier structure to a connector on the circuit board of the rotary cable assembly.

2. The system of claim 1, wherein a first portion of the rotary cable assembly comprises the spool, wherein the first portion of the rotary cable assembly remains stationary relative to the sensor carrier structure when the sensor carrier structure is rotated by the actuator system.

3. The system of claim 1, wherein the flexible electrical cable is configured to provide at least one of power and data connectivity to the one or more sensors on the sensor carrier structure, wherein the flexible electrical cable is configured to tighten or loosen when a first portion of the rotary cable assembly and the circuit board rotate around an axis of a second portion of the rotary cable assembly that includes the spool, and wherein the flexible electrical cable tightens or loosens at least partly based on a rotation of the sensor carrier structure.

4. The system of claim 1, wherein the rotary cable assembly is located on a portion of the base that remains stationary relative to the sensor carrier structure when the sensor carrier structure is moved or repositioned by the actuator system.

5. The system of claim 4, wherein a first portion of the rotary cable assembly and the circuit board rotate around an axis of a second portion of the rotary cable assembly at least partly based on a rotation of the sensor carrier structure, and wherein the second portion of the rotary cable assembly includes the spool.

6. The system of claim 5, wherein the flexible electrical cable is configured to tighten or loosen at least partly based on the rotation of the sensor carrier structure.

7. The system of claim 1, wherein the one or more electrical cables connect the one or more sensors on the sensor carrier structure to the connector on the circuit board via at least one connector on the sensor carrier structure that is electrically coupled to the connector via at least one electrical cable.

8. The system of claim 1, further comprising a second connector on at least one of the circuit board or a second circuit board on the rotary cable assembly, wherein the second connector is configured to connect to one or more electrical components on at least one of the base and an autonomous vehicle via a second rotary cable assembly on the sensor positioning platform.

9. The system of claim 8, wherein the second rotary cable assembly comprises:
a second spool;
a second portion coupled to a shaft and configured to rotate with respect to the spool;
a second flexible electrical cable stored by the second spool in the coiled configuration;
the second circuit board comprising the second connector electrically coupled to one end of the second flexible electrical cable, the second connector being configured to connect to the one or more electrical components on at least one of the base and the autonomous vehicle; and
a third circuit board comprising a third connector electrically coupled to a different end of the second flexible electrical cable, the third circuit board being configured to rotate with the second portion of the second rotary cable assembly.

10. The system of claim 1, wherein the actuator system comprises a motor configured to move and reposition the sensor carrier structure and the one or more sensors on the sensor carrier structure during an operation of a vehicle associated with the sensor positioning platform.

11. A rotary cable assembly comprising:
a first portion having a spool and a shaft extending from the spool;
a second portion coupled to the shaft, the second portion being configured to rotate with respect to the first portion, a flexible electrical cable stored by the spool in a coiled configuration within the first portion; and
one or more circuit boards comprising one or more connectors electrically coupled to the flexible electrical cable and one or more electrical components on a sensor positioning platform.

12. The rotary cable assembly of claim 11, wherein a circuit board of the one or more circuit boards is configured to rotate with the second portion, and wherein a connector of the one or more connectors is configured to connect to one or more sensors on a sensor carrier structure of the sensor positioning platform via one or more electrical cables.

13. The rotary cable assembly of claim 12, wherein the actuator system is configured to rotate the sensor carrier structure relative to at least part of a base, and wherein the first portion of the rotary cable assembly remains stationary relative to the sensor carrier structure when the sensor carrier structure is rotated by the actuator system.

14. The rotary cable assembly of claim 11, wherein the flexible electrical cable comprises a flexible printed circuit configured to provide power and data connectivity to one or more sensors on a sensor carrier structure of the sensor positioning platform.

15. The rotary cable assembly of claim 14, wherein the flexible printed circuit is configured to tighten or loosen when the second portion of the rotary cable assembly and a circuit board of the one or more circuit boards rotate around an axis of the first portion of the rotary cable assembly, and wherein the flexible printed circuit tightens or loosens at least partly based on a rotation of the sensor carrier structure.

16. The rotary cable assembly of claim 11, wherein the rotary cable assembly is located on a portion of a base of the sensor positioning platform that remains stationary relative to a sensor carrier structure of the sensor positioning platform when the sensor carrier structure is moved or repositioned by an actuator system on the base, wherein the second portion of the rotary cable assembly and a circuit board of the one or more circuit boards rotate around an axis of the first portion of the rotary cable assembly at least partly based on a rotation of the sensor carrier structure.

17. A method comprising:
mounting a sensor positioning platform to a vehicle, the sensor positioning platform comprising a sensor carrier structure rotatably coupled to a base, wherein the sensor carrier structure comprises one or more sensors and the base comprises an actuator system configured to rotate the sensor carrier structure relative to the base;
mounting a rotary cable assembly to the sensor positioning platform, the rotary cable assembly comprising a spool, a flexible electrical cable stored by the spool in a coiled configuration within the rotary cable assembly, and a circuit board; and
connecting the one or more sensors on the sensor carrier structure to a connector of the circuit board.

18. The method of claim 17, wherein a first portion of the rotary cable assembly comprises the spool, wherein the first portion of the rotary cable assembly remains stationary relative to the sensor carrier structure when the sensor carrier structure is rotated by the actuator system.

19. The method of claim 17, wherein the flexible electrical cable is configured to provide at least one of power and data connectivity to the one or more sensors on the sensor carrier structure, wherein the flexible electrical cable is configured to tighten or loosen when a first portion of the rotary cable assembly and the circuit board rotate around an axis of a second portion of the rotary cable assembly that includes the spool, and wherein the flexible electrical cable tightens or loosens at least partly based on a rotation of the sensor carrier structure.

20. The method of claim 17, further comprising:
 moving, using the actuator system, the sensor carrier structure and the one or more sensors on the sensor carrier structure during an operation of the vehicle; and
 obtaining, from the one or more sensors, sensor data at least one of before the sensor carrier structure is moved, as the sensor carrier structure is moved, and after the sensor carrier structure is moved.

\* \* \* \* \*